United States Patent
Lee et al.

(10) Patent No.: US 10,762,947 B2
(45) Date of Patent: Sep. 1, 2020

(54) MEMORY DEVICES

(71) Applicant: SAMSUNG ELECTRONICS CO., LTD., Suwon-si (KR)

(72) Inventors: Dong-Keon Lee, Hwaseong-si (KR); Kyung-Soo Ha, Hwaseong-si (KR); Hyong-Ryol Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/388,961

(22) Filed: Apr. 19, 2019

(65) Prior Publication Data
US 2020/0111523 A1    Apr. 9, 2020

(30) Foreign Application Priority Data

Oct. 4, 2018   (KR) .................. 10-2018-0118038
Nov. 29, 2018  (KR) .................. 10-2018-0151160

(51) Int. Cl.
| | | |
|---|---|---|
| *G11C 11/4076* | (2006.01) | |
| *G11C 11/408* | (2006.01) | |
| *G11C 11/4096* | (2006.01) | |
| *H01L 25/065* | (2006.01) | |
| *G06F 11/10* | (2006.01) | |

(Continued)

(52) U.S. Cl.
CPC ...... *G11C 11/4076* (2013.01); *G06F 11/1068* (2013.01); *G11C 11/4087* (2013.01); *G11C 11/4096* (2013.01); *G11C 29/52* (2013.01); *H01L 25/0657* (2013.01); *H01L 25/18* (2013.01); *H01L 2225/06513* (2013.01); *H01L 2225/06541* (2013.01)

(58) Field of Classification Search
CPC ............ G11C 11/4076; G11C 11/4087; G11C 11/4096; G11C 29/52; G06F 11/1068; H01L 25/0657
USPC ........................................................ 365/191
See application file for complete search history.

(56) References Cited

U.S. PATENT DOCUMENTS

| | | |
|---|---|---|
| 6,865,135 B2 | 3/2005 | Choi |
| 7,450,442 B2 | 11/2008 | Kang |
| 7,975,162 B2 | 7/2011 | Kim et al. |

(Continued)

FOREIGN PATENT DOCUMENTS

KR    10-2018-0034738 A    4/2018

*Primary Examiner* — Xiaochun L Chen
(74) *Attorney, Agent, or Firm* — Sughrue Mion, PLLC

(57) ABSTRACT

A memory device is provided. The memory device receives a main clock signal and provides an internal main clock signal; a data clock buffer to receive a data clock signal; and a latency control circuit configured to generate latency information based on the data clock signal and provide the latency information to a data circuit. The latency control circuit includes: a divider configured to generate divided-by-two clock signals based on the data clock signal; a divider configured to generate divided-by-four clock signals based on a first group of the divided-by-two clock signals; a first synchronization detector configured to output divided-by-two alignment signals indicating whether a second group of divided-by-two clock signals is synchronized with the data clock signal; and a latency selector configured to detect phases of the divided-by-four clock signals based on the divided-by-two alignment signals and adjust a latency of the main clock signal based on the phases.

20 Claims, 26 Drawing Sheets

(51) Int. Cl.
*G11C 29/52* (2006.01)
*H01L 25/18* (2006.01)

(56) References Cited

U.S. PATENT DOCUMENTS

| | | |
|---|---|---|
| 8,130,890 B2 | 3/2012 | Kim et al. |
| 8,207,976 B2 | 6/2012 | Hein |
| 8,306,169 B2 | 11/2012 | Kim et al. |
| 2007/0240012 A1* | 10/2007 | Burney .............. G06F 1/10 713/500 |
| 2009/0174445 A1* | 7/2009 | Kim .............. G11C 7/1051 327/153 |
| 2010/0257324 A1 | 10/2010 | Osawa et al. |
| 2018/0090186 A1 | 3/2018 | Kang et al. |

\* cited by examiner

-ALIGNED CASE-

MEMORY DEVICES

CROSS-REFERENCE TO RELATED APPLICATIONS

This application claims priority from Korean Patent Application No. 10-2018-0118038 filed on Oct. 4, 2018 in the Korean Intellectual Property Office and Korean Patent Application No. 10-2018-0151160 filed on Nov. 29, 2018 in the Korean Intellectual Property Office, the disclosures of which are incorporated herein by reference in their entireties.

BACKGROUND

Field

The present disclosure relates to memories, and more particularly to memory devices including latency control circuits.

Related Art

Dynamic random access memory (DRAM) may receive a command and an address in synchronization with a main clock signal CK. The DRAM may also receive or transmit data in synchronization with a data clock signal WCK. A DRAM performs two main operations. These include an operation of writing data in a memory cell array included in a core circuit and an operation of reading the data from the memory cell array. Control signals, which are generated to control the core circuit based on the main clock signal CK, and data, which is input/output to/from the core circuit based on the data clock signal WCK, are supplied in different clock domains. Therefore, the DRAM synchronizes the main clock signal CK and the data clock signal WCK so that input/output data can be stably latched in response to the control signals.

SUMMARY

One or more example embodiments provide a memory device including a latency control circuit capable of controlling latency associated with data input/output by using phase information generated in the memory device.

According to an aspect of an example embodiment, there is provided a memory device. The memory device includes comprising: a clock buffer configured to receive a main clock signal and to provide an internal main clock signal to a core circuit; a data clock buffer to receive a data clock signal; and a latency control circuit configured to generate latency information based on the data clock signal and provide the latency information to a data input/output (I/O) circuit. The latency control circuit includes: a first divider configured to generate a plurality of divided-by-two clock signals based on the data clock signal, wherein the plurality of divided-by-two clock signals comprises a first group of divided-by-two clock signals and a second group of divided-by-two clock signals; a second divider configured to generate a plurality of divided-by-four clock signals based on the first group of divided-by-two clock signals; a first synchronization detector configured to output a plurality of divided-by-two alignment signals indicating whether the second group of divided-by-two clock signals is synchronized with the data clock signal, wherein the plurality of divided-by-two alignment signals being generated based on phases of the second group of divided-by-two clock signals based on a clock synchronization signal; and a latency selector configured to detect automatically phases of the plurality of divided-by-four clock signals based on the plurality of divided-by-two alignment signals and adjust a latency of the main clock signal based on the phases of the plurality of divided-by-four clock signals.

According to an aspect of an example embodiment, there is provided a memory device. The memory device includes a memory cell array comprising a plurality of bank arrays; a command decoder configured to output a clock synchronization signal based on a clock synchronization command synchronized with a main clock signal; a bank control logic configured to generate a plurality of bank control signals to control the plurality of bank arrays based on a bank address in an address signal; a clock synchronizing circuit configured to generate a plurality of divided-by-two clock signals based on a data clock signal and output one of the plurality of divided-by-two clock signals as an internal data clock signal; a latency control circuit configured to generate a plurality of divided-by-four clock signals based a first group of the plurality of divided-by-two clock signals, generate a plurality of divided-by-two alignment signals that indicate whether the plurality of divided-by-two clock signals is synchronized with the data clock signal based on the clock synchronization signal, identify phases of the plurality of divided-by-four clock signals based on the plurality of divided-by-two alignment signals, and adjust a latency associated with the main clock signal based on the phases of the plurality of divided-by-four clock signals to output latency information associated with the internal data clock signal; and a data input/output (I/O) circuit configured to transceive data based on the internal data clock signal and the latency information. Each of the plurality of bank arrays comprises a plurality of dynamic memory cells coupled to a plurality of word-lines and a plurality of bit-lines.

According to an aspect of an example embodiment, there is provided a memory device. The memory device includes at least one buffer die; and a plurality of memory dies stacked on the at least one buffer die and configured to transceive data through a plurality of through silicon via lines. At least one of the plurality of memory dies comprises a memory cell array, and the at least one buffer die includes: a clock synchronizing circuit configured to generate a plurality of divided-by-two clock signals based on a data clock signal and output one of the plurality of divided-by-two clock signals as an internal data clock signal; a latency control circuit configured to generate a plurality of divided-by-four clock signals based on a first group of the plurality of divided-by-two clock signals, generate a plurality of divided-by-two alignment signals indicating whether the plurality of divided-by-two clock signals is synchronized with the data clock signal based on a clock synchronization signal, identify phases of the plurality of divided-by-four clock signals based on the plurality of divided-by-two alignment signals, and adjust latency of a main clock signal based on the phases of the plurality of divided-by-four clock signals, and output latency information associated with the internal data clock signal; and a data input/output circuit configured to transceive the data based on the internal data clock signal and the latency information.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present.

Figure 1:
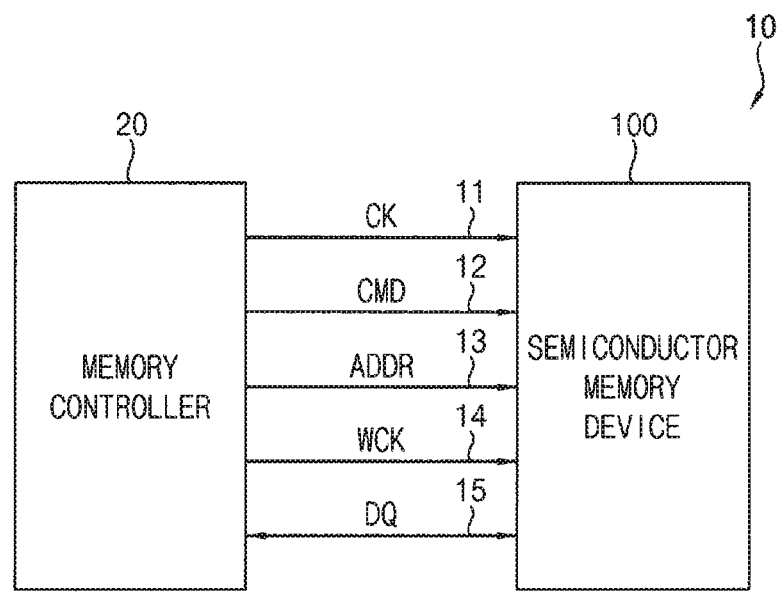
FIG. 1 is a block diagram illustrating a memory system according to one or more example embodiments.

FIG. 1 is a block diagram illustrating a memory system according to one or more example embodiments.

Referring to FIG. 1, a memory system 10 may include a memory controller 20 and a memory device 100, such as a semiconductor memory device. The memory system 10 may support data communication between the memory controller 20 and the memory device 100 by using a main clock signal CK and a data clock signal WCK.

A first clock signal line 11, a command bus 12, an address bus 13, a second clock signal line 14, and a data bus 15 may be connected between the memory controller 20 and the memory device 100. According to an example embodiment, the memory system 10 may support the data communication based on various clock signals in addition to the main clock signal CK and the data clock signal WCK.

The main clock signal CK generated by the memory controller 20 may be supplied to the memory device 100 through the first clock signal line 11. For example, the main clock signal CK may be supplied as a continuous alternating inversion signal along with an inversion main clock signal CKB. Regarding a main clock signal pair CK and CKB, rising/falling edges may be detected with respect to an intersection point of the main clock signal CK and the inversion main clock signal CKB, and thus, a timing accuracy is increased. Herein, the main clock signal CK may be referred to as a first clock signal CK.

The first clock signal line 11 may transmit a complementary continuous alternating inversion signal based on the main clock signal pair CK and CKB. In this case, the first clock signal line 11 may include two signal lines for transmitting the main clock signal CK and the inversion main clock signal CKB. The clock signal CK described herein may refer to the main clock signal pair CK and CKB. For convenience of explanation, the main clock signal pair CK and CKB is referred to as a main clock signal CK.

A command CMD and an address ADDR supplied from the memory controller 20 may be supplied to the memory device 100 through the command bus 12 and the address bus 13, respectively.

The data clock signal WCK and data DQ may be transmitted to a data interface between the memory controller 20 and the memory device 100. The data clock signal WCK generated by the memory controller 20 may be supplied to the memory device 100 through the second clock signal line 14. The data clock signal WCK may be supplied as a continuous alternating inversion signal along with an inversion data clock WCKB. Regarding a data clock signal pair WCK and WCKB, rising/falling edges may be detected with respect to an intersection point of the data clock signal WCK and the inversion data clock signal WCKB, and thus, a timing accuracy is increased.

The second clock signal line 14 may transmit a complementary continuous alternating inversion signal based on the data clock signal pair WCK and WCKB. In this case, the second clock signal line 14 may be configured to include two signal lines for transmitting the data clock signal WCK and the inversion data clock signal WCKB. The data clock signal WCK described herein may refer to the data clock signal pair WCK and WCKB. Herein, the data clock signal pair WCK and WCKB may be referred to as the data clock signal WCK.

The data DQ synchronized with the data clock signal WCK may be transmitted through the data bus 15 connected between the memory controller 20 and the memory device 100. For example, write data DQ, which corresponds to a burst length BL and is supplied from the memory controller 20, may be transmitted to the memory device 100 through the data bus 15 in synchronization with the data clock signal WCK. The write data DQ, which corresponds to the burst length BL and is read from the memory device 100, may be latched in synchronization with the data clock signal WCK and may be transmitted to the memory controller 20 through the data bus 15.

If the memory device 100 is implemented with DRAM, a core circuit of the DRAM may not operate according to a speed of a high speed data interface. This is due to a limitation in increasing a frequency of the main clock signal CK transmitted to the core circuit of the DRAM. Therefore, the DRAM may use a method of increasing a data interface speed while maintaining an operation speed of the core circuit of the DRAM.

Figure 2:
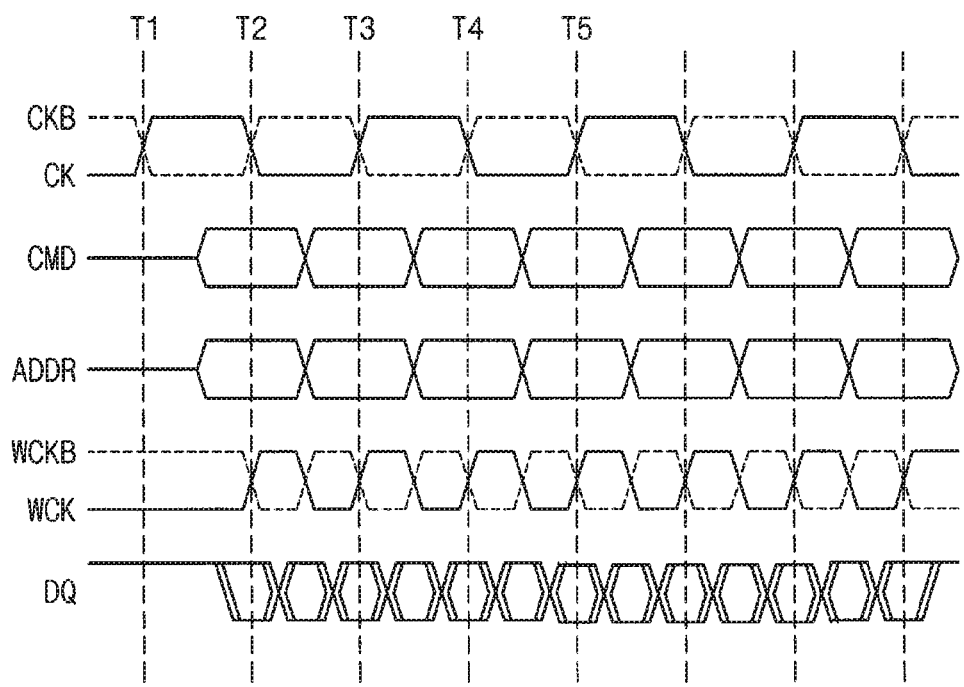
FIG. 2 is a timing diagram for describing a high speed data interface operation according to one or more example embodiments.

FIG. 2 is a timing diagram for describing a high speed data interface operation of a memory device according to one or more example embodiments.

Referring to FIGS. 1 and 2, the main clock signal CK may be transmitted from the memory controller 20, and the command CMD and the address signal ADDR may be transmitted based on the main clock signal CK. The data DQ may be transmitted based on the data clock signal WCK. For a high speed data interface, a frequency of the data clock signal WCK may be set to be multiple of the frequency of the main clock signal CK.

For example, a data writing operation may be performed in the memory device 100. The memory device 100 may receive the main clock signal CK from a time point T1 and may receive a write command CMD and a write address signal ADDR based on the main clock signal CK at a time point T2. In addition, at the time point T2, the memory device 100 may receive the write data DQ corresponding to the burst length BL, based on the data clock signal WCK.

Above, the memory device 100 is described as receiving the write command CMD and the write data DQ at the time point T2. It is to be understood, however, that the memory device 100 may receive the write command CMD, and then, may receive the write data DQ after a write latency. The write latency may be represented as a multiple of a cycle of the main clock signal CK.

A data reading operation may also be performed in the memory device 100. The memory device 100 may receive the main clock signal CK from the time point T1 and may receive a read command CMD and a read address signal ADDR based on the main clock signal CK at the time point T2. In addition, after the read command CMD is received, the memory device 100 may receive read data DQ based on the data clock signal WCK after a read latency. The read latency may be represented as a multiple of the cycle of the main clock signal CK.

In a write operation, the memory device 100 may sample the data DQ input from the memory controller 20 by using the data clock signal WCK, and may store data, obtained through the sampling, in a memory cell array by using the main clock signal CK. In addition, in a read operation, the memory device 100 may read the data from the memory cell array by using the main clock signal CK and may transmit the read data to the memory controller 20 by using the data clock signal WCK. As described above, the memory device 100 may operate in different clock domains, for example, a multiple clock domain.

In the memory device 100, data transfer is performed between a domain which operates based on the main clock signal CK and a domain which operates based on the data clock signal WCK. In other words, domain crossing occurs between the main clock signal CK and the data clock signal WCK. Missing data may occur due to the domain crossing. To prevent missing data, a clock synchronizing operation between the main clock signal CK and the data clock signal WCK is performed. The clock synchronizing operation between the main clock signal CK and the data clock signal WCK will be described below with reference to FIGS. 3 and 4.

Figure 3:
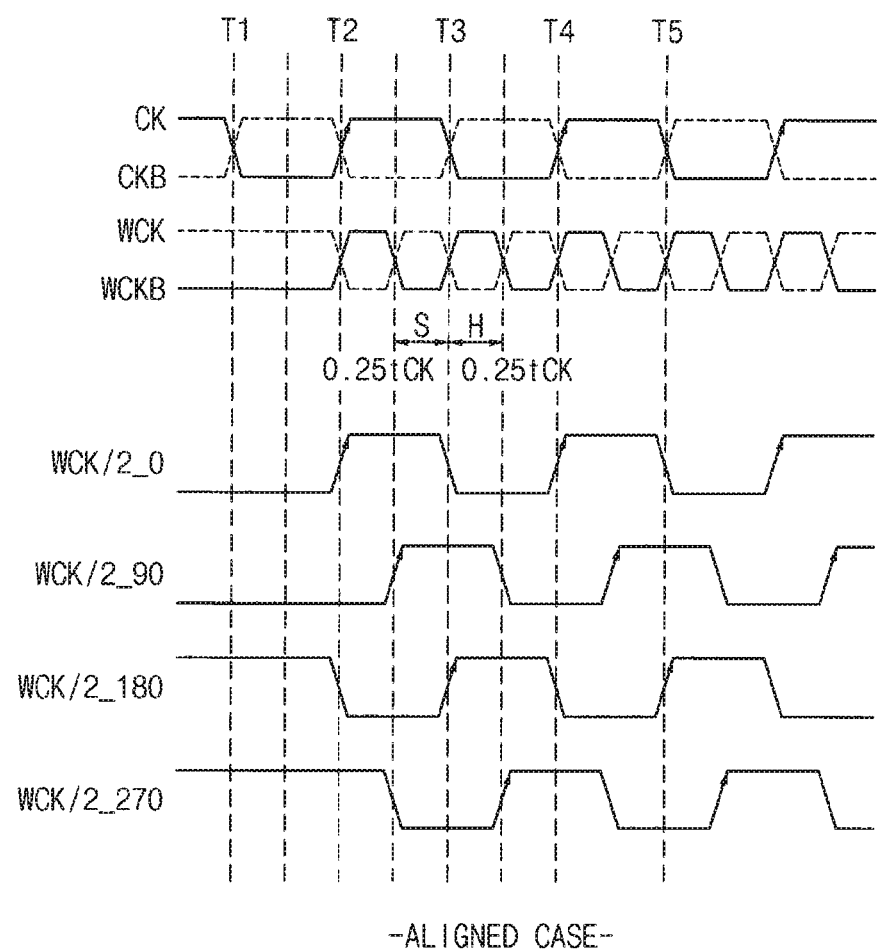
FIGS. 3 and 4 are diagrams for describing a clock synchronizing operation according to one or more example embodiments.
Figure 4:
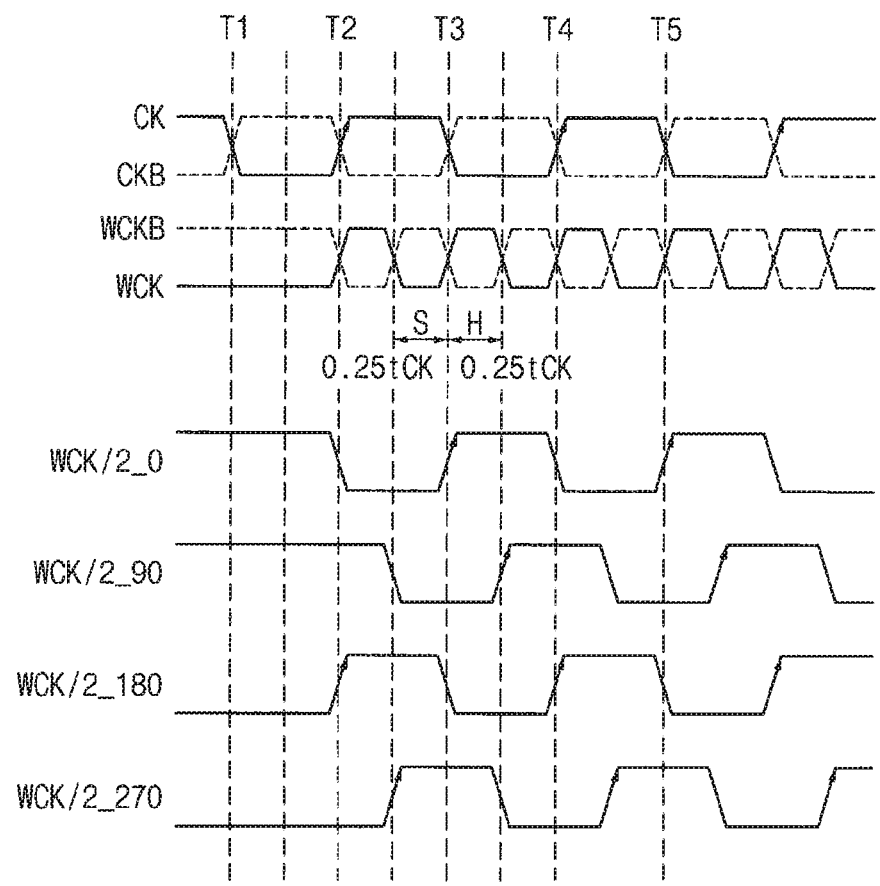

FIGS. 3 and 4 are diagrams for describing a clock synchronizing operation according to one or more example embodiments. For example, the clock synchronizing operation illustrated in FIGS. 3 and 4 may be implemented in the memory device in FIG. 1.

FIG. 3 illustrates an aligned state in which clock synchronization between the main clock signal CK and the data clock signal WCK occurs. FIG. 4 illustrates a misaligned state in which clock synchronization does not occur.

Referring to FIG. 3, the main clock signal CK and the data clock signal WCK may be received by the memory device 100 (see FIG. 1). A frequency of the data clock signal WCK may be higher than that of the main clock signal CK. For example, a frequency of the data clock signal WCK may be multiple of a frequency of the main clock signal CK.

The main clock signal CK may be received from a time point T1. A falling edge of the main clock signal CK may be input at the time point T1, a rising edge of the main clock signal CK may be input at a time point T2, a falling edge of the main clock signal CK may be input at a time point T3, a rising edge of the main clock signal CK may be input at a time point T4, and a falling edge of the main clock signal CK may be input at a time point T5.

The data clock signal WCK may be received from the time point T2. Because the data clock signal WCK is supplied along with corresponding data DQ whenever the write data DQ is input or the read data DQ is output, the data clock signal WCK may be in a deactivation state at the time point T1, and then, may be activated at the time point T2 when the corresponding data DQ is supplied.

When the data clock signal WCK is received at the time point T2, the memory device 100 may divide the data clock signal WCK to generate a plurality of divided data clock signals WCK/2_0, WCK/2_90, WCK/2_180, and WCK/2_270. In this case, the memory device 100 may divide the data clock signal WCK by two to generate the plurality of divided-by-two data clock signals WCK/2_0, WCK/2_90, WCK/2_180, and WCK/2_270.

From the time point T2 when the data clock signal WCK is received, a first divided-by-two data clock signal WCK/2_0 may be generated to have the same phase as that of the main clock signal CK, a second divided-by-two data clock signal WCK/2_90 may be generated to have a phase obtained through a 90-degree shift from a phase of the main clock signal CK, a third divided-by-two data clock signal WCK/2_180 may be generated to have a phase obtained through a 180-degree shift from the phase of the main clock signal CK, and a fourth divided-by-two data clock signal WCK/2_270 may be generated to have a phase obtained through a 270-degree shift from the phase of the main clock signal CK.

The memory device 100, for example, may have an align margin including a setup time S of 0.25tCK and a hold time H of 0.25tCK when determining a falling edge of the first divided-by-two data clock signal WCK/2_0 at the time point T3. The memory device 100 may determine a logic level of the first divided-by-two data clock signal WCK/2_0 based on a falling edge of the main clock signal CK, based on the setup time S of 0.25tCK and the hold time H of 0.25tCK. When the determined logic level of the first divided-by-two data clock signal WCK/2_0 is logic low, the memory device 100 may determine the first divided-by-two data clock signal WCK/2_0 as having a falling edge.

In FIG. 3, it may be seen that a rising edge of the first divided data clock signal WCK/2_0 corresponds to the rising edge of the main clock signal CK, and a falling edge of the first divided data clock signal WCK/2_0 corresponds to the falling edge of the main clock signal CK.

FIG. 4 illustrates a misaligned state in which clock synchronization does not occur between the main clock signal CK and the data clock signal WCK. Referring to FIG. 4, at a time point T2 when the data clock signal WCK is received, a falling edge of the first divided-by-two data clock signal WCK/2_0 may be generated, in contrast to a rising edge of the main clock signal CK at the time point T2. At a time point T3, a rising edge of the first divided-by-two data clock signal WCK/2_0 may be generated, which is in contrast to a falling edge of the main clock signal CK at the time point T3.

At a time point T4, a falling edge of the first divided-by-two data clock signal WCK/2_0 may be generated, which is in contrast to the rising edge of the main clock signal CK at the time point T4. In addition, at a time point T5, a rising edge of the first divided-by-two data clock signal WCK/2_0 may be generated, which is in contrast to the falling edge of the main clock signal CK at the time point T5.

Regarding FIG. 4, it can be seen that a falling edge of the first divided-by-two data clock signal WCK/2_0 is generated at time points that correspond to the rising edge of the main clock signal CK, and a rising edge of the first divided-by-two data clock signal WCK/2_0 is generated at time points that correspond to the falling edge of the main clock signal CK. This shows a misaligned state in which clock synchronization does not occur between the main clock signal CK and the data clock signal WCK.

For example, at the time point T3, to determine that the first divided-by-two data clock signal WCK/2_0 is generated as a rising edge with the falling edge of the main clock signal CK, the memory device 100 may determine a logic level of the first divided-by-two data clock signal WCK/2_0 based on a falling edge of the main clock signal CK, based on a setup time S of 25% of a clock cycle (0.25tCK) and a hold time H of 0.25tCK. When the determined logic level of the first divided data clock signal WCK/2_0 is logic high, the memory device 100 may determine the first divided data clock signal WCK/2_0 as having a rising edge.

In an example embodiment, a method of performing the clock synchronizing operation and latency controlling by using the data clock signal WCK having a variable frequency (e.g., a dynamic frequency) to correct the insufficiency of the align margin in the clock synchronizing operation.

Figure 5:
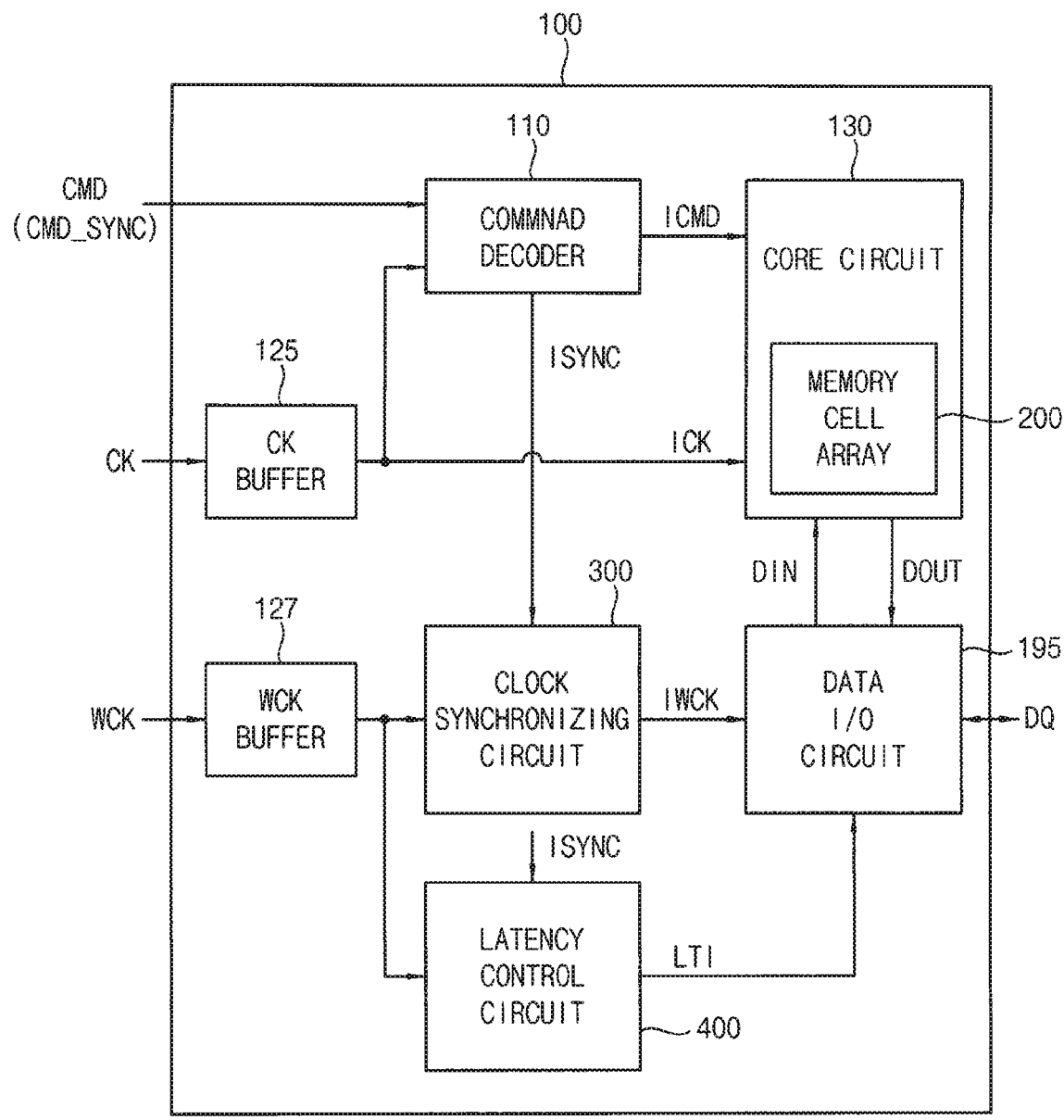
FIG. 5 is a block diagram illustrating a memory device according to one or more example embodiments.

FIG. 5 is a block diagram illustrating a memory device according to one or more example embodiments. For example, the memory device 100 illustrated in FIG. 5 may correspond to the memory device 100 illustrated in FIG. 1.

Referring to FIG. 5, the memory device 100 may include a command decoder 110, a main clock buffer 125, a core circuit 130, a data clock buffer 127, a clock synchronizing circuit 300, a latency control circuit 400 and a data input/output (I/O) circuit 195.

The command decoder 110 may receive a command CMD or CMD_SYNC transmitted through the command bus 12 (see FIG. 1) from the memory controller 20 (see FIG. 1). The command decoder 110 may decode the received command CMD to generate an internal command signal ICMD and a clock synchronization signal ISYNC.

The command decoder 110 may generate the internal command signal ICMD including a read signal or a write signal according to a received read command or write command. The internal command signal ICMD may be supplied to the core circuit 130. The internal command signal ICMD may control a data reading operation or a data writing operation performed by the core circuit 130.

The command decoder 110 may generate the clock synchronization signal ISYNC based on the received clock synchronization command CMD_SYNC or an internal main clock signal ICK supplied from the main clock buffer 125. The clock synchronization signal ISYNC may be generated as a pulse signal with a period corresponding to the received clock synchronization command CMD_SYNC. The clock synchronization signal ISYNC may be supplied to the clock synchronizing circuit 300 and the latency control circuit 400.

The main clock buffer 125 may receive the main clock signal CK transmitted through the first clock signal line 11 (see FIG. 1) from the memory controller 20. The main clock buffer 125 may buffer the received main clock signal CK to generate the internal main clock signal ICK and may supply the internal main clock signal ICK to the command decoder 110 and the core circuit 130. A phase of the buffered internal main clock signal ICK may be approximately equal to that of the main clock signal CK.

The core circuit 130 may include a memory cell array 200. In a read operation of the memory device 100, the core circuit 130 may read data from the memory cell array 200 according to the internal command signal ICMD and the internal main clock signal ICK which are read signals. In a write operation of the memory device 100, the core circuit 130 may write data in the memory cell array 200 based on the internal command signal ICMD and the internal main clock signal ICK which are write signals.

The core circuit 130 will be described in additional detail below with reference to FIG. 6.

The data clock buffer 127 may receive the data clock signal WCK transmitted through the second clock signal line 14 (see FIG. 1) from the memory controller 20. The data clock buffer 127 may buffer the received data clock signal WCK to supply the buffered data clock signal WCK to the clock synchronizing circuit 300 and the latency control circuit 400.

The clock synchronizing circuit 300 may receive the data clock signal WCK buffered by the data clock buffer 127 and the clock synchronization signal ISYNC. The clock synchronizing circuit 300 may perform a clock synchronizing operation based on the data clock signal WCK buffered by the data clock buffer 127 and the clock synchronization signal ISYNC. As a result of the clock synchronizing operation, the clock synchronizing circuit 300 may generate an internal data clock signal IWCK which includes first, second, third and fourth internal data clock signals. The internal data clock signal IWCK may be supplied to the data I/O circuit 195.

The data I/O circuit 195 may include a data input circuit and a data output circuit. The data input circuit may align and latch the write data DQ input through the data bus 15 (see FIG. 1) based on the internal data clock signal IWCK to supply write data DIN to the memory cell array 200. The data output circuit may transmit read data DOUT, read from the memory cell array 200, as output data DQ to the memory controller 20 based on the internal data clock signal IWCK.

In a write operation, the data I/O circuit 195 may operate so that the write data DQ input from the memory controller 20 is sampled by using the internal data clock signal IWCK, and data obtained through the sampling is written in the memory cell array 200 by using the internal main clock signal ICK. In addition, in a read operation, the data I/O circuit 195 may operate so that data is read from the memory cell array 200 by using the internal main clock signal ICK, and the read data is transmitted to the memory controller 20 by using the internal data clock signal IWCK.

The latency control circuit 400 may receive the data clock signal WCK, may generate a plurality of divided-by-two clock signals by dividing the data clock signal WCK by two based on the clock synchronization signal ISYNC, may generate a plurality of divided-by-four clock signals by dividing first two of the divided-by-two clock signals by two, may detect phases of second two of the divided-by-two clock signals, may generate divided-by-two alignment signals indicating whether the divided-by-two clock signals are synchronized with the data clock signal, may detect phases of the divided-by-four clock signals based on the divided-by-two alignment signals, and may adjust latency of the main clock signal based on the phases of the divided-by-four clock signals to output the adjusted latency as latency information LTI of the internal data clock signal IWCK which is used for receiving/transmitting the data DQ. The latency control circuit 400 provides the latency information LTI to the data I/O circuit 195. The data I/O circuit 195 may receive/transmit the data DQ by using the internal data clock signal IWCK according to a latency corresponding to the latency information LTI in a write operation and a read operation.

In the memory device 100, because the internal main clock signal ICK and the internal data clock signal IWCK are synchronized with each other by the clock synchronizing circuit 300 and a latency is controlled based on a synchronized divided-by-four clock signal of the divided-by-four clock signal, synchronization may be made between a domain operating based on the internal main clock signal ICK and a domain operating based on the internal data clock signal IWCK. Therefore, the memory device 100 may perform data communication without missing data in a high speed data interface.

Figure 6:
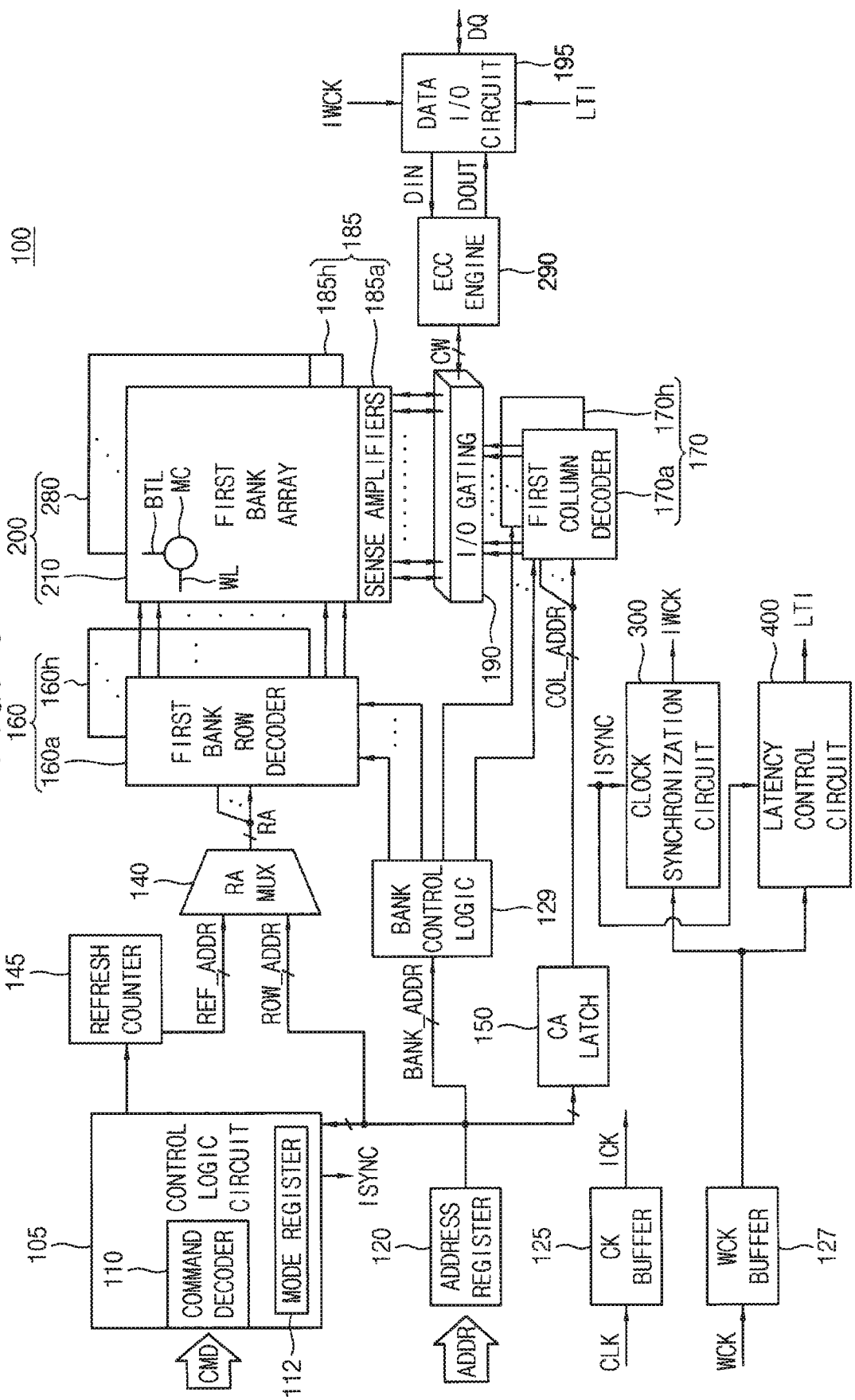
FIG. 6 is a block diagram illustrating a memory device according to one or more example embodiments.

FIG. 6 is a block diagram illustrating a memory device according to one or more example embodiments. For example, the memory device illustrated in FIG. 6 may correspond to the memory device illustrated in FIG. 5.

Referring to FIG. 6, the memory device 100 includes a control logic circuit 105, an address register 120, the main clock buffer 125, the data clock buffer 127, a bank control logic 129, a refresh counter 145, a row address multiplexer 140, a column address latch 150, a row decoder 160, a column decoder 170, the memory cell array 200, a sense amplifier unit 185, an I/O gating circuit 190, an error correction code (ECC) engine 290, the data I/O circuit 195, the clock synchronizing circuit 300 and the latency control circuit 400. The row decoder 160, the column decoder 170, the memory cell array 200, the sense amplifier unit 185, and the I/O gating circuit 190 may be included in the core circuit 130 in FIG. 5.

The memory cell array 200 includes first through eighth bank arrays 210~280. The row decoder 160 includes first through eighth bank row decoders 160a~160h respectively coupled to the first through eighth bank arrays 210~280, the column decoder 170 includes first through eighth bank column decoders 170a~170h respectively coupled to the first through eighth bank arrays 210~280, and the sense amplifier unit 185 includes first through eighth bank sense amplifiers 185a~185h respectively coupled to the first through eighth bank arrays 210~280. Each of the first through eighth bank arrays 210~280 includes a plurality of memory cells MC formed at intersections of a plurality of word-lines WL and a plurality of bit-lines BTL.

The address register 120 receives the address ADDR including a bank address BANK_ADDR, a row address ROW_ADDR and a column address COL_ADDR from the memory controller 20. The address register 120 provides the received bank address BANK_ADDR to the bank control logic 129, provides the received row address ROW_ADDR to the row address multiplexer 140, and provides the received column address COL_ADDR to the column address latch 150.

The bank control logic 129 generates bank control signals based on the bank address BANK_ADDR. One of the first through eighth bank row decoders 160a~160h corresponding to the bank address BANK_ADDR is activated based on the bank control signals, and one of the first through eighth bank column decoders 170a~170h corresponding to the bank address BANK_ADDR is activated based on the bank control signals.

The row address multiplexer 140 receives the row address ROW_ADDR from the address register 120, and receives a refresh row address REF_ADDR from the refresh counter 145. The row address multiplexer 140 selectively outputs the row address ROW_ADDR or the refresh row address REF_ADDR as a row address RA. The row address RA that is output from the row address multiplexer 140 is applied to the first through eighth bank row decoders 160a~160h.

The refresh counter 145 may sequentially output the refresh row address REF_ADDR under control of the control logic circuit 105.

The activated one of the first through eighth bank row decoders 160a~160h, by the bank control logic 129, decodes the row address RA that is output from the row address multiplexer 140, and activates a word-line corresponding to the row address RA. For example, the activated bank row decoder applies a word-line driving voltage to the word-line corresponding to the row address.

The column address latch 150 receives the column address COL_ADDR from the address register 120, and temporarily stores the received column address COL_ADDR. In some example embodiments, for example in a burst mode, the column address latch 150 generates column addresses that increment from the received column address COL_ADDR. The column address latch 150 applies the temporarily stored or generated column address to the first through eighth bank column decoders 170a~170h. The activated one of the first through eighth bank column decoders 170a~170h, which activates a sense amplifier corresponding to the bank address BANK_ADDR and the column address COL_ADDR through the I/O gating circuit 190.

The I/O gating circuit 190 includes circuitry for gating input/output data, and further includes input data mask logic, read data latches for storing data that is output from the first through eighth bank arrays 210~280, and write drivers for writing data to the first through eighth bank arrays 210~280.

Codeword CW read from one bank array of the first through eighth bank arrays 210~280 is sensed by a sense amplifier coupled to the one bank array from which the data is to be read, and is stored in the read data latches. The codeword CW stored in the read data latches may be provided to the data I/O circuit 195 as the data DOUT after ECC decoding is performed on the codeword CW by the ECC engine 290.

The data DIN to be written in one bank array of the first through eighth bank arrays 210~280 may be provided to the ECC engine 290 from the data I/O circuit 195, the ECC engine 290 may perform an ECC encoding on the data DIN.

The control logic circuit 105 may control operations of the memory device 100. For example, the control logic circuit 105 may generate control signals for the memory device 100 in order to perform a write operation or a read operation. The control logic circuit 105 includes the command decoder 110 that decodes the command CMD received from the memory controller 20 and a mode register 112 that sets an operation mode of the memory device 100. For example, the command decoder 110 may generate the control signals corresponding to the command CMD by decoding a write enable signal, a row address strobe signal, a column address strobe signal, a chip select signal, etc. The command decoder 110 may generate the clock synchronization signal ISYNC by decoding the clock synchronization command CMD_SYNC.

Figure 7:
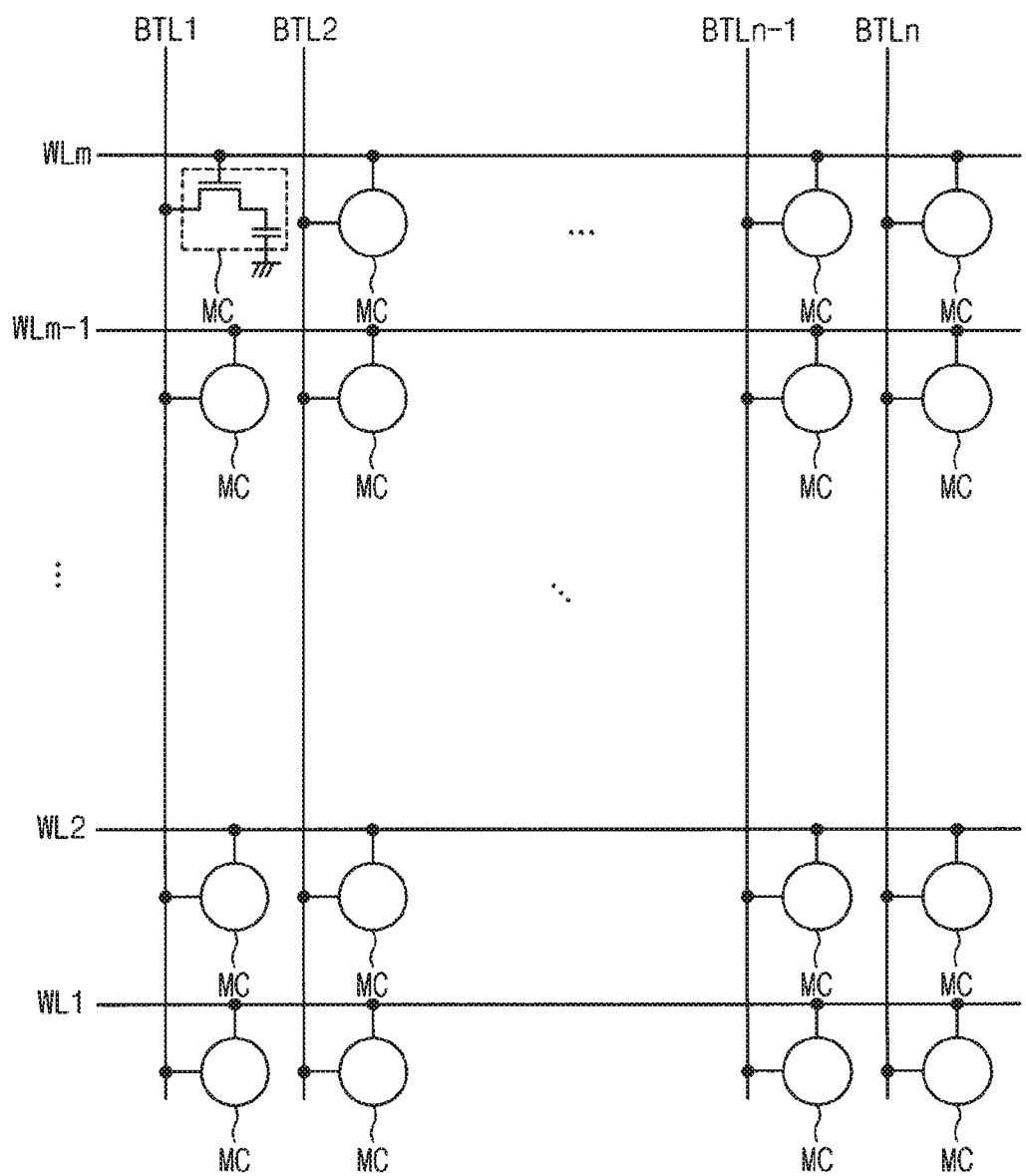
FIG. 7 illustrates an example of a first bank array in a memory device according to one or more example embodiments.

FIG. 7 illustrates an example of a first bank array in a memory device according to one or more example embodiments. For example, the first bank array of FIG. 7 may be implemented in the memory device of FIG. 6.

Referring to FIG. 7, the first bank array 210 includes a plurality of word-lines WL1~WLm (m is a natural number greater than two), a plurality of bit-lines BTL1~BTLn (n is a natural number greater than two), and a plurality of dynamic memory cells MCs disposed at intersections between the word-lines WL1~WLm and the bit-lines BTL1~BTLn. Each of the dynamic memory cells MCs includes a cell transistor coupled to each of the word-lines WL1~WLm and each of the bit-lines BTL1~BTLn and a cell capacitor coupled to the cell transistor.

Figure 8:
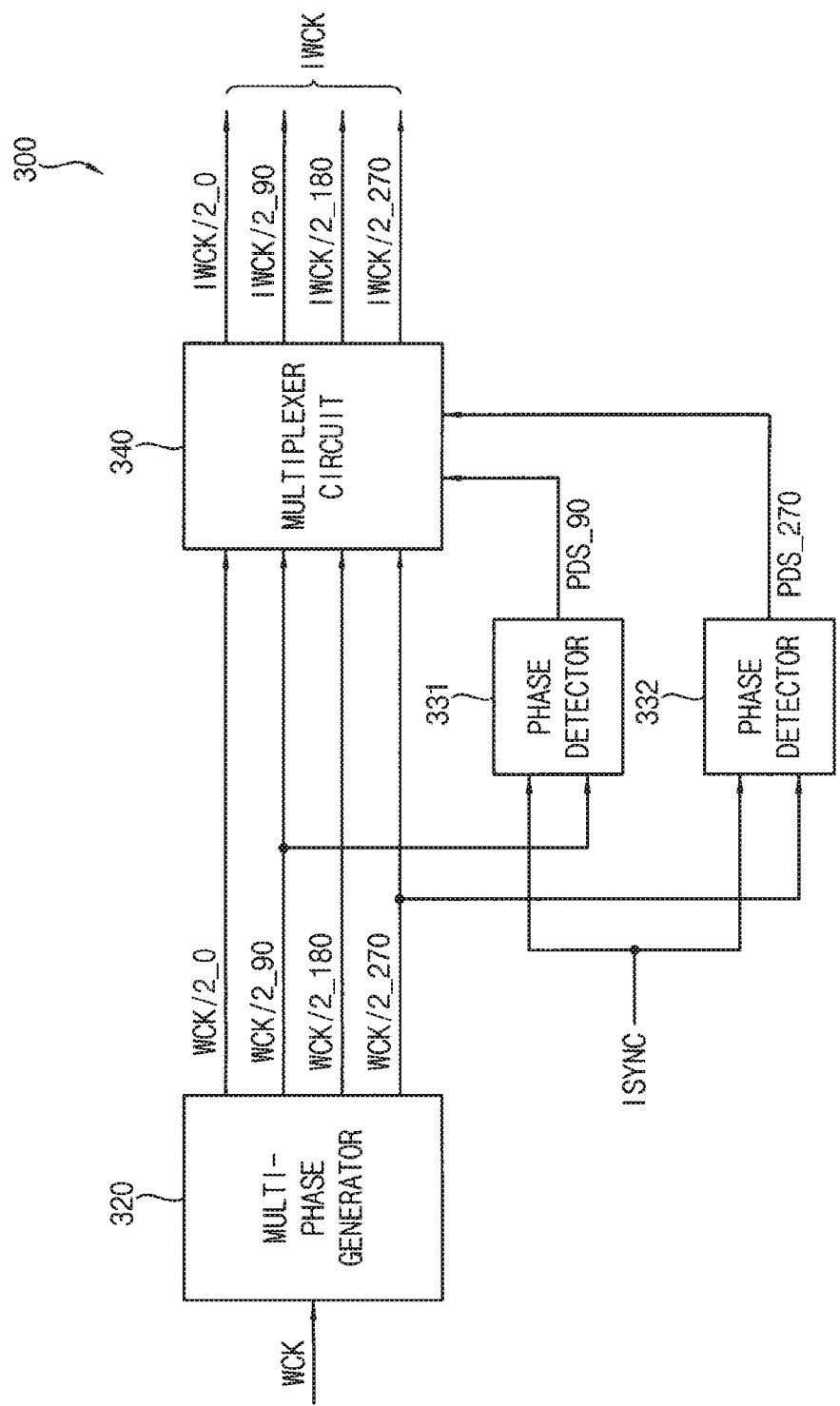
FIG. 8 is a block diagram illustrating a clock synchronizing circuit in a memory device according to one or more example embodiments.

FIG. 8 is a block diagram illustrating a clock synchronizing circuit according to one or more example embodiments. For example, the clock synchronizing circuit may be implemented in the memory device of FIG. 5.

Referring to FIG. 8, the clock synchronizing circuit 300 may divide the data clock signal WCK to generate a plurality of divided-by-two clock signals WCK/2_0, WCK/2_90, WCK/2_180, and WCK/2_270 and may generate the internal data clock signal IWCK which is synchronized with the internal main clock signal ICK based on the clock synchronization signal ISYNC.

The clock synchronizing circuit 300 may include a multi-phase generator 320, first phase detector 331, second phase detector 332, and a multiplexer circuit 340.

The multi-phase generator 320 may shift a phase of the data clock signal WCK by 0 degrees, 90 degrees, 180 degrees, and 270 degrees by using a divider to generate first through fourth divided-by-two clock signals WCK/2_0, WCK/2_90, WCK/2_180, and WCK/2_270. For example, the multi-phase generator 320 may generate the first through fourth divided-by-two clock signals WCK/2_0, WCK/2_90, WCK/2_180, and WCK/2_270 respectively having phases obtained from 0-degree, 90-degree, 180-degree, and 270-degree phase shifts of an output of the divider which receives the data clock signal WCK as input.

Based on the second divided-by-two clock signals WCK/2_90, the first phase detector 331 may latch the clock synchronization signal ISYNC to generate first phase detection signal PDS_90. Based on the fourth divided-by-two clock signals WCK/2_270, the second phase detector 332 may latch the clock synchronization signal ISYNC to generate second phase detection signal PDS_270.

The first phase detector 331 may include a flip-flop that latches the clock synchronization signal ISYNC to output the first phase detection signal PDS_90 based on the second divided-by-two clock signal WCK/2_90. The second phase detector 332 may include a flip-flop that latches the clock synchronization signal ISYNC to output the second phase detection signal PDS_270 based on the fourth divided-by-two clock signal WCK/2_270.

Because the clock synchronization signal ISYNC is generated in association with the internal main clock signal ICK, the second divided-by-two clock signal WCK/2_90 aligned with the clock synchronization signal ISYNC may be a signal synchronized with the internal main clock signal ICK.

Figure 9:
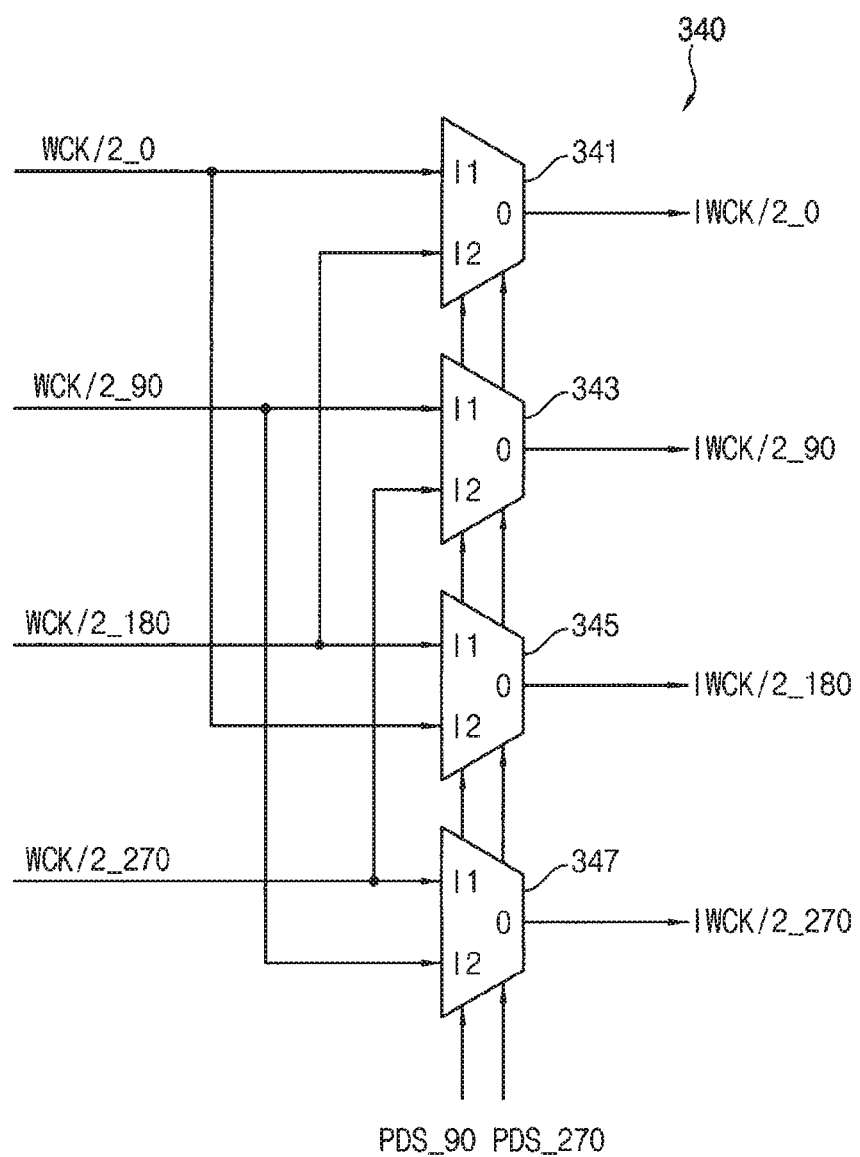
FIG. 9 is a circuit diagram illustrating a multiplexer circuit according to one or more example embodiments.

FIG. 9 is a circuit diagram illustrating an example of a multiplexer circuit according to one or more example embodiments. For example, the multiplexer circuit of FIG. 9 may be implemented in the clock synchronizing circuit illustrated in FIG. 8.

Referring to FIG. 9, the multiplexer circuit 340 may include first through fourth multiplexers 341, 343, 345, and 347. The first multiplexer 341 may receive the first divided-by-two clock signal WCK/2_0 through a first input terminal I1 and may receive, through a second input terminal I2, the third divided-by-two clock signal WCK/2_180 which is in a state where its phase is inverted by 180 degrees with respect to the first divided-by-two clock signal WCK/2_0. The first multiplexer 341 may select one signal from among the first divided-by-two clock signal WCK/2_0 at the first input terminal I1 and the third divided-by-two clock signal WCK/2_180 at the second input terminal I2. The first multiplexer 341 may output the selected signal as the first internal data clock signal IWCK/2_0 based on the first and second phase detection signals PDS_90 and PDS_270.

For example, when the first phase detection signal PDS_90 is at a logic high level and the second phase detection signal PDS_270 is at a logic low level, the first multiplexer 341 may select the first divided-by-two clock signal WCK/2_0 at the first input terminal I1 to be output as the first internal data clock signal IWCK/2_0. On the other hand, when the first phase detection signal PDS_90 is at a logic high level and the second phase detection signal PDS_270 is at a logic high level, the first multiplexer 341 may select the third divided-by-two clock signal WCK/2_180 at the second input terminal I2 to be output as the first internal data clock signal IWCK/2_0.

The second multiplexer 343 may receive the second divided-by-two clock signal WCK/2_90 through a first input terminal I1 and may receive, through a second input terminal I2, the fourth divided-by-two clock signal WCK/2_270 which is in a state where its phase is inverted by 180 degrees with respect to the second divided-by-two clock signal WCK/2_90. The second multiplexer 343 may select one signal from among the second divided-by-two clock signal WCK/2_90 and the fourth divided-by-two clock signal WCK/2_270 to be output as the second internal data clock signal IWCK/2_90 based on the first and second phase detection signals PDS_90 and PDS_270.

The third multiplexer 345 may receive the third divided-by-two clock signal WCK/2_180 through a first input terminal I1 and may receive, through a second input terminal I2, the first divided-by-two clock signal WCK/2_0 which is in a state where its phase is inverted by 180 degrees with respect to the third divided-by-two clock signal WCK/2_180. The third multiplexer 345 may select one signal from among the third divided-by-two clock signal WCK/2_180 and the first divided-by-two clock signal WCK/2_0 to be output as the third internal data clock signal IWCK/2_180 based on the first and second phase detection signals PDS_90 and PDS_270.

The fourth multiplexer 347 may receive the fourth divided-by-two clock signal WCK/2_270 through a first input terminal I1 and may receive, through a second input terminal 12, the second divided-by-two clock signal WCK/2_90 which is in a state where its phase is inverted by 180 degrees with respect to the fourth divided-by-two clock signal WCK/2_270. The fourth multiplexer 347 may select one signal from among the fourth divided-by-two clock signal WCK/2_270 and the second divided-by-two clock signal WCK/2_90 to be output as the fourth internal data clock signal IWCK/2_270 based on the first and second phase detection signals PDS_90 and PDS_270.

Figure 10:
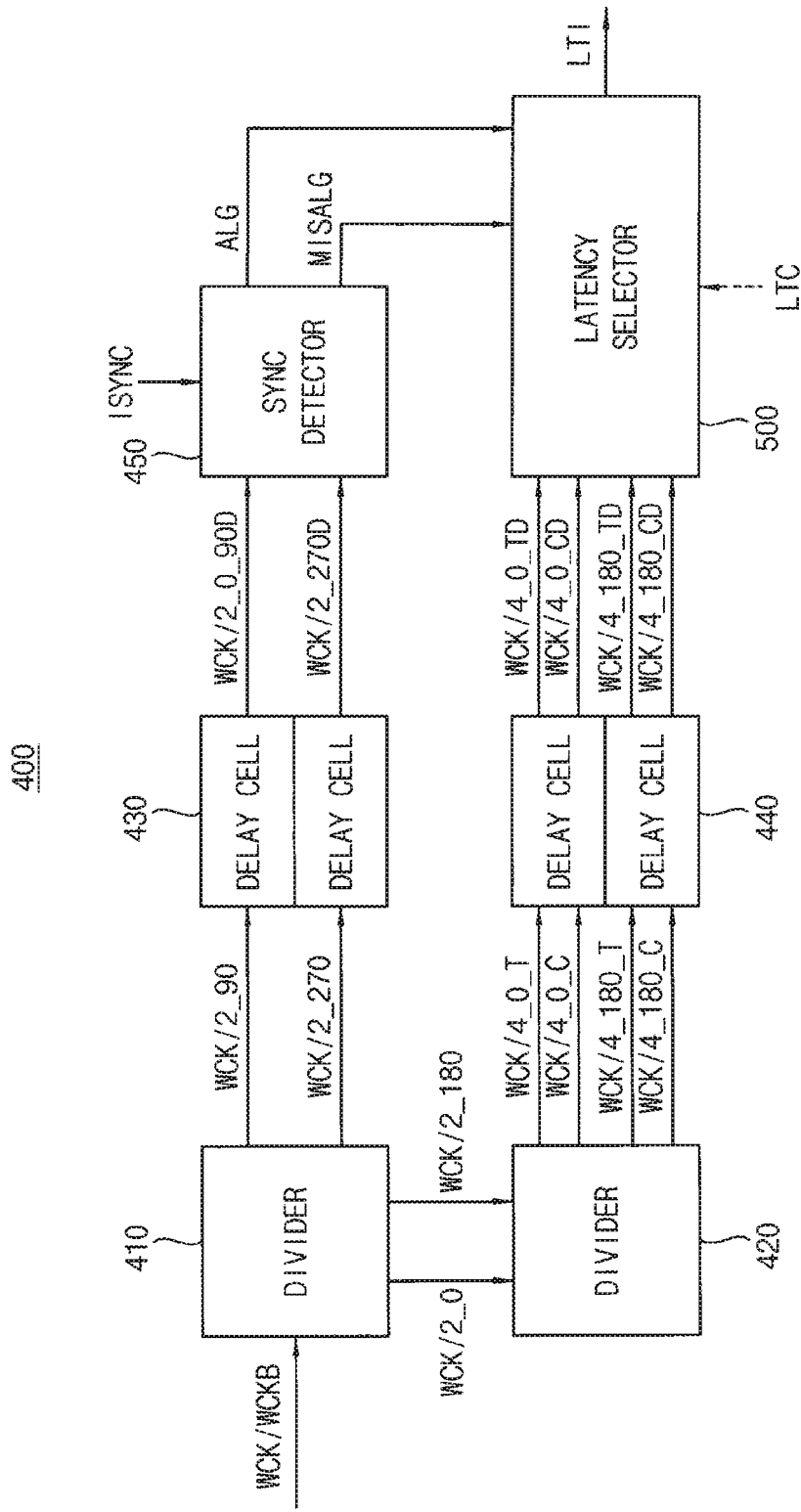
FIG. 10 is a block diagram illustrating a latency control circuit according to one or more example embodiments.

FIG. 10 is a block diagram illustrating a latency control circuit according to one or more example embodiments. For example, the latency control circuit of FIG. 10 may be implemented in the memory device of FIG. 5.

Referring to FIG. 10, the latency control circuit 400 may include a first divider 410, a second divider 420, first delay cells 430, second delay cells 440, a first synchronization detector 450 and a latency selector 500. In an example embodiment, the first delay cells 430 and the second delay cells 440 may be not included in the latency control circuit 400. In addition, the latency control circuit 400 may receive the first through fourth divided-by-two clock signals WCK/2_0, WCK/2_90, WCK/2_180, and WCK/2_270 from the clock synchronizing circuit 300. In this case, the first divider 410 may be not included in the latency control circuit 400.

The first divider 410 may divide the data clock signal WCK/WCKB to generate the first through fourth divided-by-two clock signals WCK/2_0, WCK/2_90, WCK/2_180, and WCK/2_270, may provide the first and third divided-by-two clock signals WCK/2_0 and WCK/2_180 to the second divider 420 and may provide the second and fourth divided-by-two clock signals WCK/2_90 and WCK/2_270 to the first delay cells 430.

The second divider 420 may divide the first and third (first two) divided-by-two clock signals WCK/2_0 and WCK/2_180 to generate first through fourth divided-by-four clock signals WCK/4_0_T, WCK/4_0_C, WCK/4_180_T, and WCK/4_180_C and may provide the first through fourth divided-by-four clock signals WCK/4_0_T, WCK/4_0_C, WCK/4_180_T, and WCK/4_180_C to the second delay cells 440.

The first delay cells 430 may delay the second and fourth divided-by-two clock signals WCK/2_90 and WCK/2_270 and may provide second and fourth delayed divided-by-two clock signals WCK/2_90D and WCK/2_270D to the first synchronization detector 450. The second delay cells 440 may delay the first through fourth divided-by-four clock signals WCK/4_0_T, WCK/4_0_C, WCK/4_180_T, and WCK/4_180_C and may provide first through fourth delayed divided-by-four clock signals WCK/4_0_TD, WCK/4_0_CD, WCK/4_180_TD, and WCK/4_180_CD to the latency selector 500.

The first synchronization detector 450 detects phases of the second and fourth (second two) delayed divided-by-two clock signals WCK/2_90D and WCK/2_270D and provides the latency selector 500 with divided-by-two alignment signals ALG and MISALG indicating whether the second and fourth delayed divided-by-two clock signals WCK/2_90D and WCK/2_270D are synchronized with the data clock signal WCK, based on the clock synchronization signal ISYNC. If the second divided-by-two clock signal WCK/2_90 is synchronized with the data clock signal WCK, the first synchronization detector 450 outputs a first divided-by-two alignment signal ALG with a high level (or, activates the first divided-by-two alignment signal ALG) based on an activation of the clock synchronization signal ISYNC. If the fourth divided-by-two clock signal WCK/2_270 is synchronized with the data clock signal WCK, the first synchronization detector 450 outputs a second divided-by-two alignment signal MISALG with a high level (or, activates the second divided-by-two alignment signal MISALG) based on an activation of the clock synchronization signal ISYNC.

The latency selector 500 receives the first through fourth delayed divided-by-four clock signals WCK/4_0_TD, WCK/4_0_CD, WCK/4_180_TD, and WCK/4_180_CD, detects phases of the first through fourth delayed divided-by-four clock signals WCK/4_0_TD, WCK/4_0_CD, WCK/4_180_TD, and WCK/4_180_CD, generates first through fourth divided-by-four alignment signals, adjusts the latency LTC of the main clock signal CK based on one of the first through fourth delayed divided-by-four clock signals WCK/4_0_TD, WCK/4_0_CD, WCK/4_180_TD, corresponding to a synchronized one of the first through fourth divided-by-four alignment signals, and provides the data I/O circuit 195 with the adjusted latency as the latency information LTI of the internal data clock signal IWCK. Each of the first through fourth divided-by-four alignment signals may indicate whether a corresponding one of the first through fourth delayed divided-by-four clock signals WCK/4_0_TD, WCK/4_0_CD, WCK/4_180_TD is synchronized with the data clock signal WCK.

In an example embodiment, the latency selector 500 may generate the first through fourth divided-by-four alignment signals by detecting phases of the first through fourth divided-by-four clock signals WCK/4_0_T, WCK/4_0_C, WCK/4_180_T, and WCK/4_180_C instead of detecting the phases of the first through fourth delayed divided-by-four clock signals WCK/4_0_TD, WCK/4_0_CD, WCK/4_180_TD.

Figure 11:
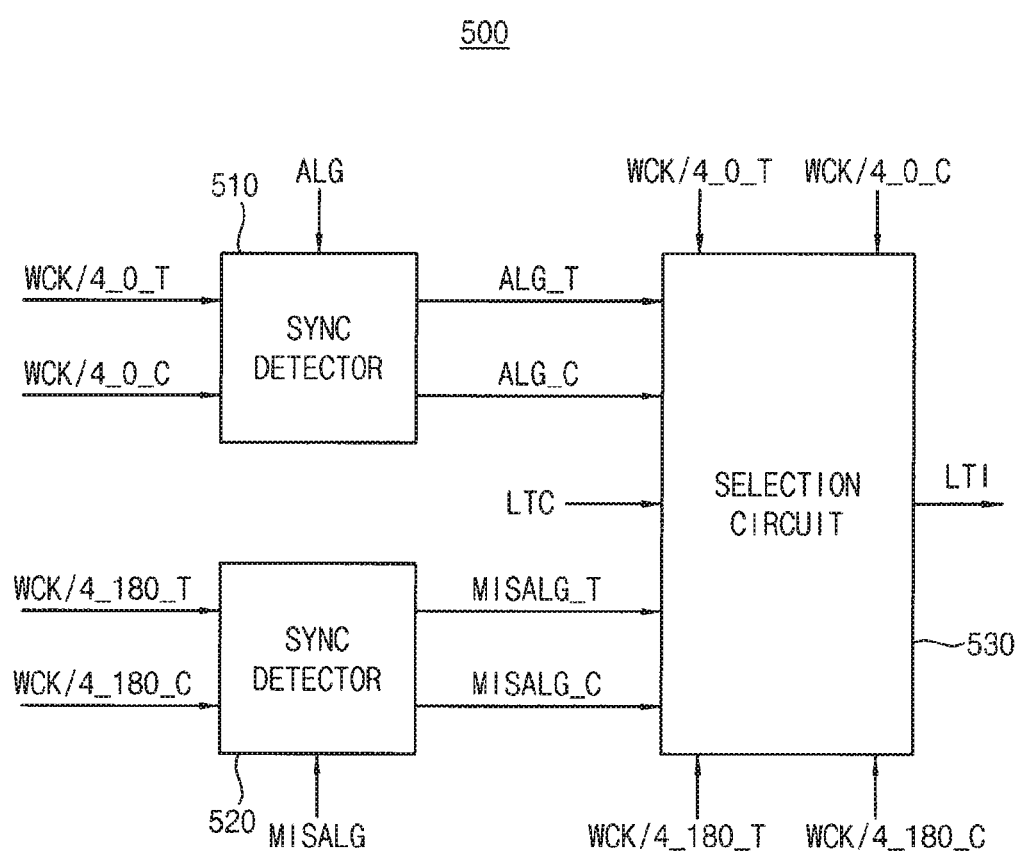
FIG. 11 is a block diagram illustrating a latency selector according to one or more example embodiments.

FIG. 11 is a block diagram illustrating a latency selector according to one or more example embodiments. For example, the latency selector illustrated in FIG. 11 may be implemented in the latency control circuit of FIG. 10.

Referring to FIG. 11, the latency selector 500 may include a second synchronization detector 510, a third synchronization detector 520 and a selection circuit 530.

The second synchronization detector 510 detects phases of the first and second divided-by-four clock signals WCK/4_0_T and WCK/4_0_C based on the first divided-by-two alignment signal ALG, and provides the selection circuit 530 with first and second divided-by-four alignment signals ALG_T and ALG_C indicating whether the first and second divided-by-four clock signals WCK/4_0_T and WCK/4_0_C are synchronized with the data clock signal WCK. The third synchronization detector 520 detects phases of the third and fourth divided-by-four clock signals WCK/4_180_T and WCK/4_180_C based on the second divided-by-two alignment signal MISALG and provides the selection circuit 530 with third and fourth divided-by-four alignment signals MISALG_T and MISALG_C indicating whether the third and fourth divided-by-four clock signals WCK/4_180_T and WCK/4_180_C are synchronized with the data clock signal WCK.

The selection circuit 530 receives the first through fourth divided-by-four clock signals WCK/4_0_T, WCK/4_0_C, WCK/4_180_T, and WCK/4_180_C, adjusts the latency of one of first through fourth divided-by-four clock signals WCK/4_0_T, WCK/4_0_C, WCK/4_180_T, and WCK/4_180_C, corresponding to an activated one of the first through fourth divided-by-four alignment signals ALG_T, ALG_C, MISALG_T and MISALG_C, based on the main clock signal CK and provides the latency information LTI associated with the data clock signal WCK to the data I/O circuit 195.

Figure 12:
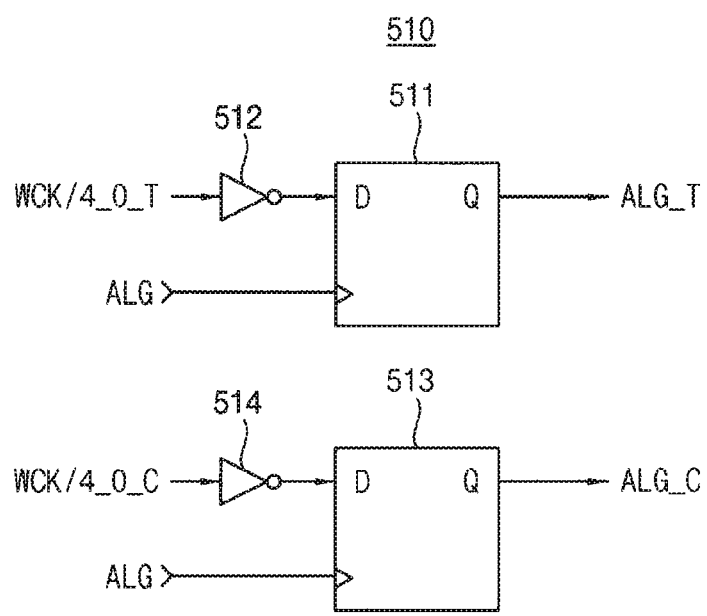
FIG. 12 illustrates a second synchronization detector according to one or more example embodiments.

FIG. 12 illustrates a second synchronization detector according to one or more example embodiments. For example, the second synchronization detector illustrated in FIG. 12 may be implemented in the latency selector illustrated in FIG. 11.

Referring to FIG. 12, the second synchronization detector 510 may include flip-flops 511 and 513 and inverters 512 and 514. The flip-flops 511 and 513 may be D flip-flops. The inverter 512 inverts the first divided-by-four clock signal WCK/4_0_T. The flip-flop 511 latches an output of the inverter 512 based on a rising edge of the first divided-by-two alignment signal ALG to output the first divided-by-four alignment signal ALG_T. The inverter 514 inverts the second divided-by-four clock signal WCK/4_0_C. The flip-flop 513 latches an output of the inverter 514 based on the rising edge of the first divided-by-two alignment signal ALG to output the second divided-by-four alignment signal ALG_C.

Figure 13:
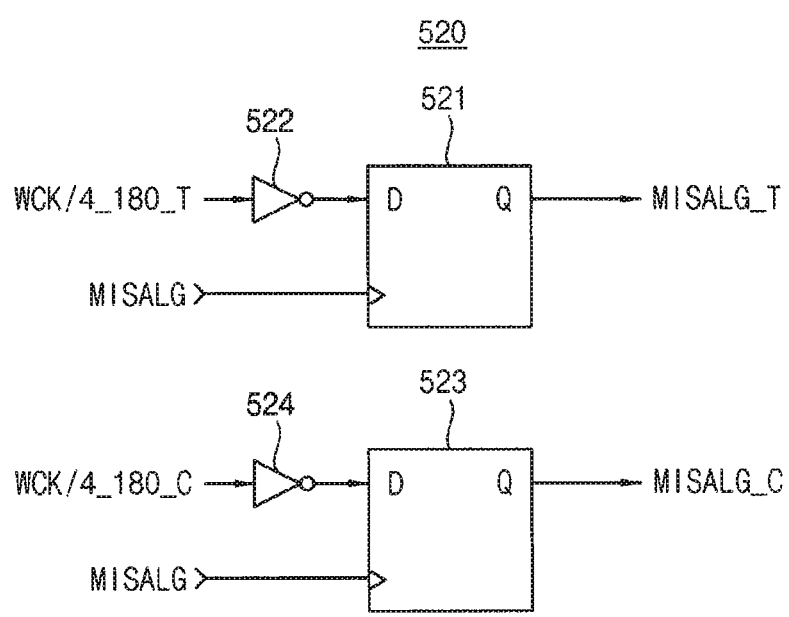
FIG. 13 illustrates a third synchronization detector according to one or more example embodiments.

FIG. 13 illustrates an example of a third synchronization detector according to one or more example embodiments. For example, the third synchronization detector illustrated in FIG. 13 may be implemented in the latency selector illustrated in FIG. 11.

Referring to FIG. 13, the third synchronization detector 520 may include flip-flops 521 and 523 and inverters 522 and 524. The flip-flops 521 and 523 may be D flip-flops. The inverter 522 inverts the third divided-by-four clock signal WCK/4_180_T. The flip-flop 521 latches an output of the inverter 522 based on a rising edge of the second divided-by-two alignment signal MISALG to output the third divided-by-four alignment signal MISALG_T. The inverter 524 inverts the fourth divided-by-four clock signal WCK/4_180_C. The flip-flop 523 latches an output of the inverter 524 based on the rising edge of the second divided-by-two alignment signal MISALG to output the fourth divided-by-four alignment signal MISALG_C.

Figure 14:
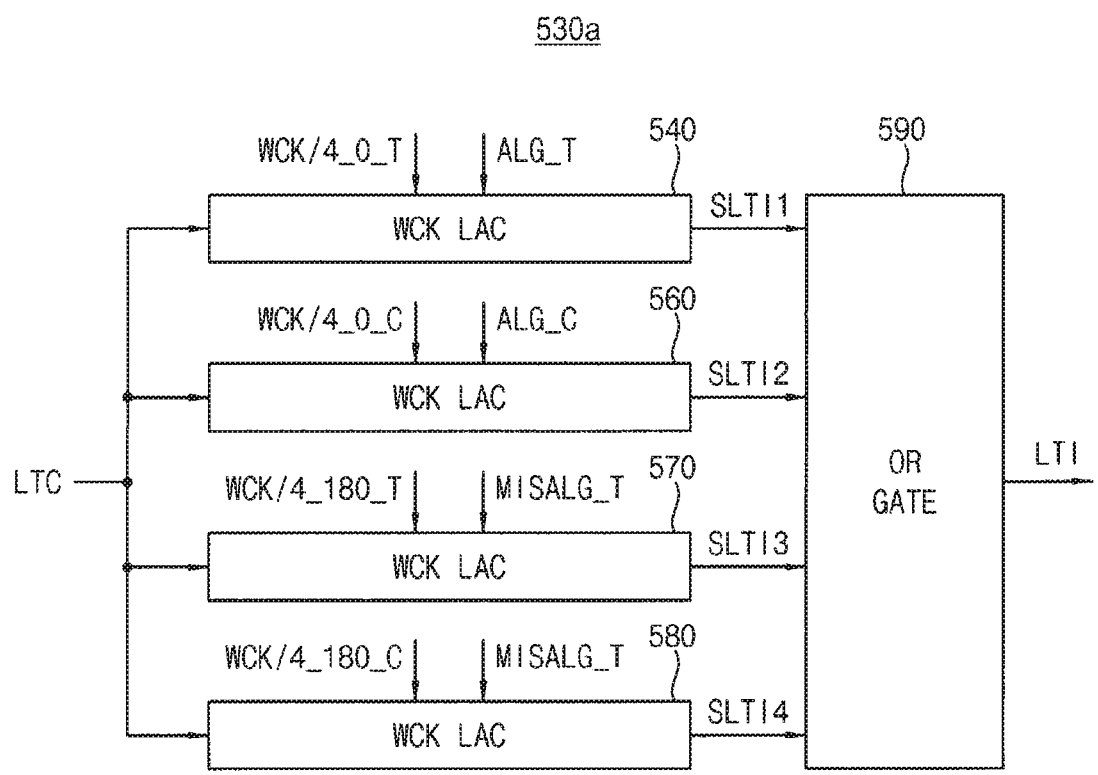
FIG. 14 is a block diagram illustrating a selection circuit according to one or more example embodiments.

FIG. 14 is a block diagram illustrating an example of a selection circuit according to one or more embodiments. For example, the selection circuit illustrated in FIG. 14 may be implemented in the latency selector illustrated in FIG. 11.

Referring to FIG. 14, a selection circuit 530a may include first through fourth latency adjusting circuits 540, 560, 570 and 580 and an OR gate 590. Each of the first through fourth latency adjusting circuits 540, 560, 570 and 580 may receive the latency LTC associated with the main clock signal CK, may receive a corresponding one of the first through fourth divided-by-four alignment signals ALG_T, ALG_C, MISALG_T and MISALG_C, may be enabled based on a corresponding one of the first through fourth divided-by-four alignment signals ALG_T, ALG_C, MISALG_T and MISALG_C, which is activated, may adjust the latency LTC associated with the main clock signal CK based on a corresponding one of the first through fourth divided-by-four clock signals WCK/4_0_T, WCK/4_0_C, WCK/4_180_T, and WCK/4_180_C, may provide the OR gate 590 with a corresponding one of the adjusted latencies as a corresponding one of sub latency information STLI1, STLI2, STLI3 and STLI4. The OR gate 590 performs an OR operation on the sub latency information STLI1, STLI2, STLI3 and STLI4 to provide the data I/O circuit 195 with the latency information LTI.

Figure 15:
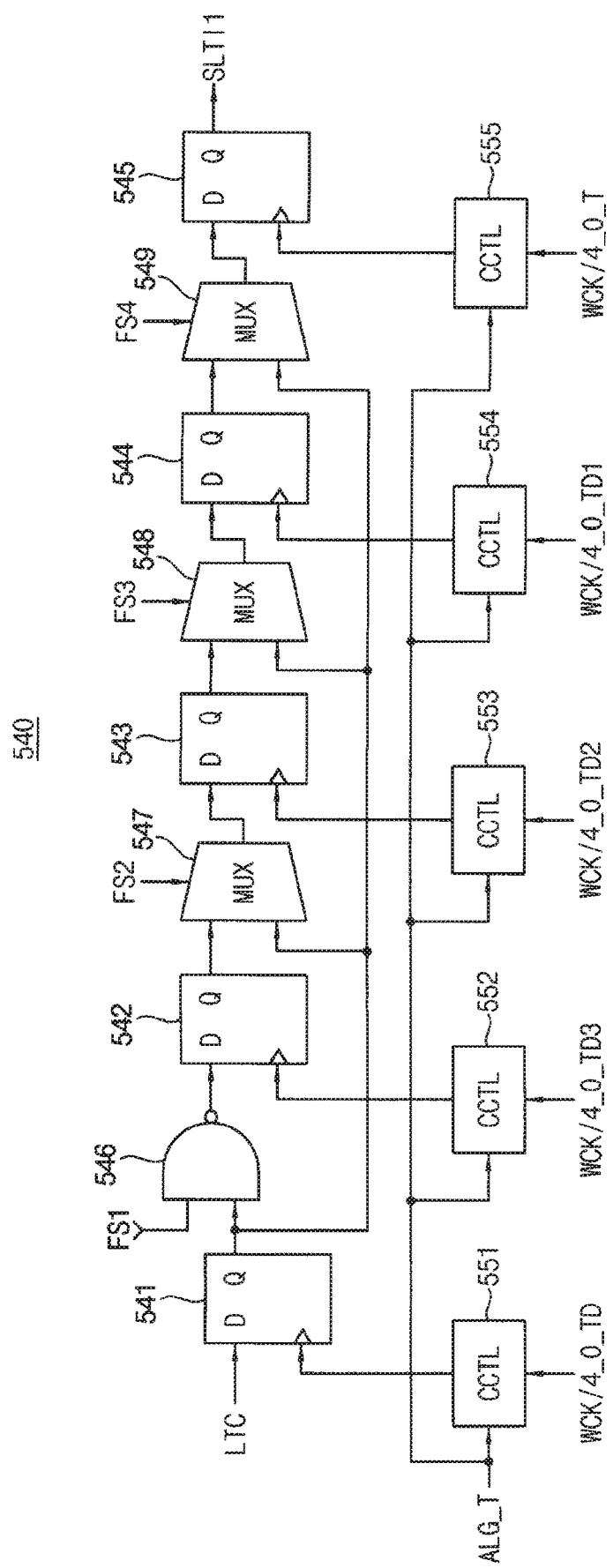
FIG. 15 is a circuit diagram illustrating a first latency adjusting circuit according to one or more example embodiments.

FIG. 15 is a circuit diagram illustrating a first latency adjusting circuit according to one or more example embodiments. For example, the first latency adjusting circuit illustrated in FIG. 15 may be implemented in the selection circuit illustrated in FIG. 14.

Configuration of each of the second through fourth latency adjusting circuits 560, 570 and 580 may be substantially the same as configuration of the first latency adjusting circuit 540.

Referring to FIG. 15, the first latency adjusting circuit 540 includes flip-flops 541~545, a NAND gate 546, multiplexers 547~549 and clock control logics 551~555. The flip-flops 541~545 may be D flip-flops.

The flip-flops 541~545, the NAND gate 546, the multiplexers 547~549 and the clock control logics 551~555 may be connected as illustrated in FIG. 15.

The flip-flop 541 latches a level of the latency LTC associated with the main clock signal CK based on a rising edge of the first delayed divided-by-four clock signal WCK/4_0_TD provided from the clock control logic 551 and outputs the latched level. The NAND gate 546 performs an NAND operation on a selection signal FS1 and an output of the flip-flop 541. The flip-flop 542 latches an output of the NAND gate 546 based on a rising edge of a delayed divided-by-four clock signal WCK/4_0_TD3 provided from the clock control logic 552. Each of the multiplexers 547~549 outputs one of a first input and a second input based on a corresponding one of selection signals FS2, FS3 and FS4. The first input of each of the multiplexers 547~549 may be the output of the flip-flop 541 and the second input of each of the multiplexers 547~549 may be an output of a corresponding one of the flip-flops 542~544. The clock control logics 551~555 may provide the first delayed divided-by-four clock signal WCK/4_0_TD, delayed divided-by-four clock signals WCK/4_0_TD3, WCK/4_0_TD2, WCK/4_0_TD1 and the divided-by-four clock signal WCK/4_0_T to first inputs of the flip-flops 541~545, respectively, based on the first divided-by-four alignment signal ALG_T. The latency LTC associated with the main clock signal CK is adjusted by the selection signals FS1~FS4 and the adjusted latency is provided as the first sub latency information STLI1 at an output of the flip-flop 545. The selection signals FS1~FS4 may be provided from outside of the latency selector 500.

Figure 16:
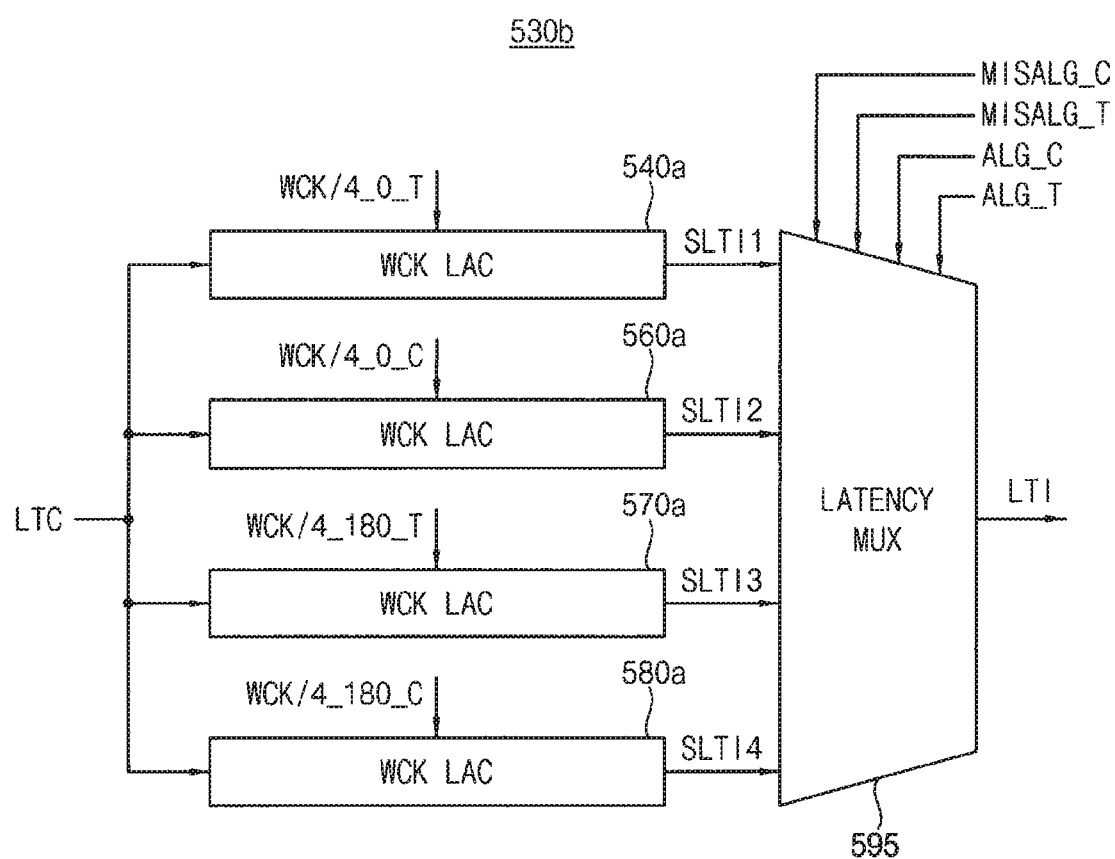
FIG. 16 is a block diagram illustrating a selection circuit according to one or more example embodiments.

FIG. 16 is a block diagram illustrating a selection circuit according to one or more embodiments. For example, the selection circuit illustrated in FIG. 16 may be implemented in the latency selector illustrated in FIG. 11.

Referring to FIG. 16, a selection circuit 530b may include first through fourth latency adjusting circuits 540a, 560a, 570a and 580a and a multiplexer 595. Each of the first through fourth latency adjusting circuits 540a 560a, 570a and 580a may receive the latency LTC associated with the main clock signal CK, may adjust the latency LTC associated with the main clock signal CK based on a corresponding one of the first through fourth divided-by-four clock signals WCK/4_0_T, WCK/4_0_C, WCK/4_180_T, and WCK/4_180_C, may provide the multiplexer 595 with a corresponding one of the adjusted latencies as a corresponding one of sub latency information STLI1, STLI2, STLI3 and STLI4. The multiplexer 595 may select one of the sub latency information STLI1, STLI2, STLI3 and STLI4 based on an activated one of the first through fourth divided-by-four alignment signals ALG_T, ALG_C, MISALG_T and MISALG_C to provide the data I/O circuit 195 with the latency information LTI.

FIGS. 17A, 17B, 17C and 17D illustrate timing control diagrams of a latency control circuit according to one or more example embodiments. For example, the timing control diagrams may correspond to the latency control circuit of FIG. 10.

In FIGS. 17A, 17B, 17C and 17D, the data clock signal WCK is received normally.

Figure 17A:
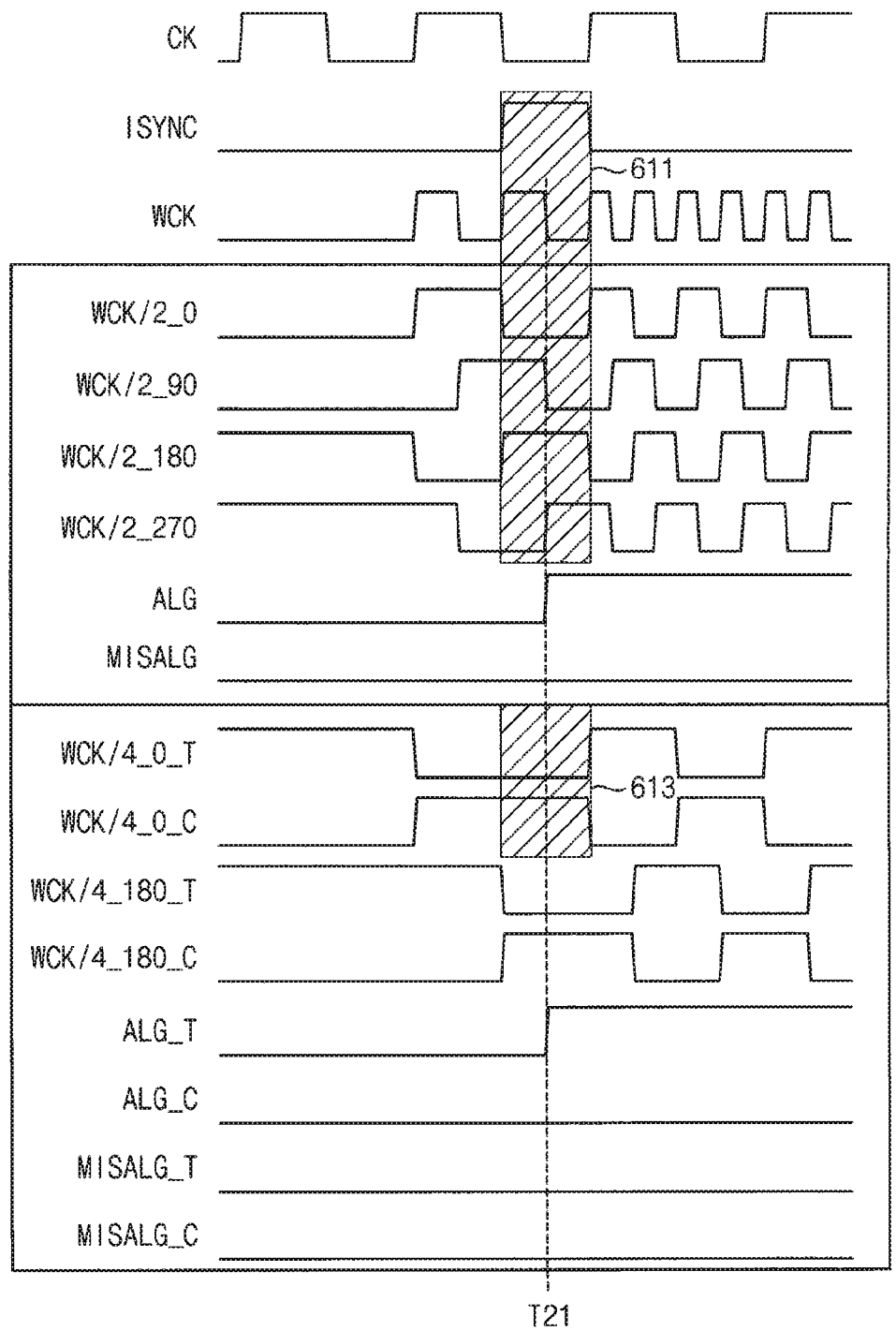
FIGS. 17A, 17B, 17C and 17D illustrate timing control diagrams of a latency control circuit according to one or more example embodiments.

Referring to FIG. 17A, the second divided-by-two clock signal WCK/2_90 and the first divided-by-four clock signal WCK/4_0_T are synchronized with the data clock signal WCK as indicated by reference numerals 611 and 613 and the first divided-by-two alignment signal ALG and the first divided-by-four alignment signal ALG_T transit to a high level from a time point T21.

Figure 17B:
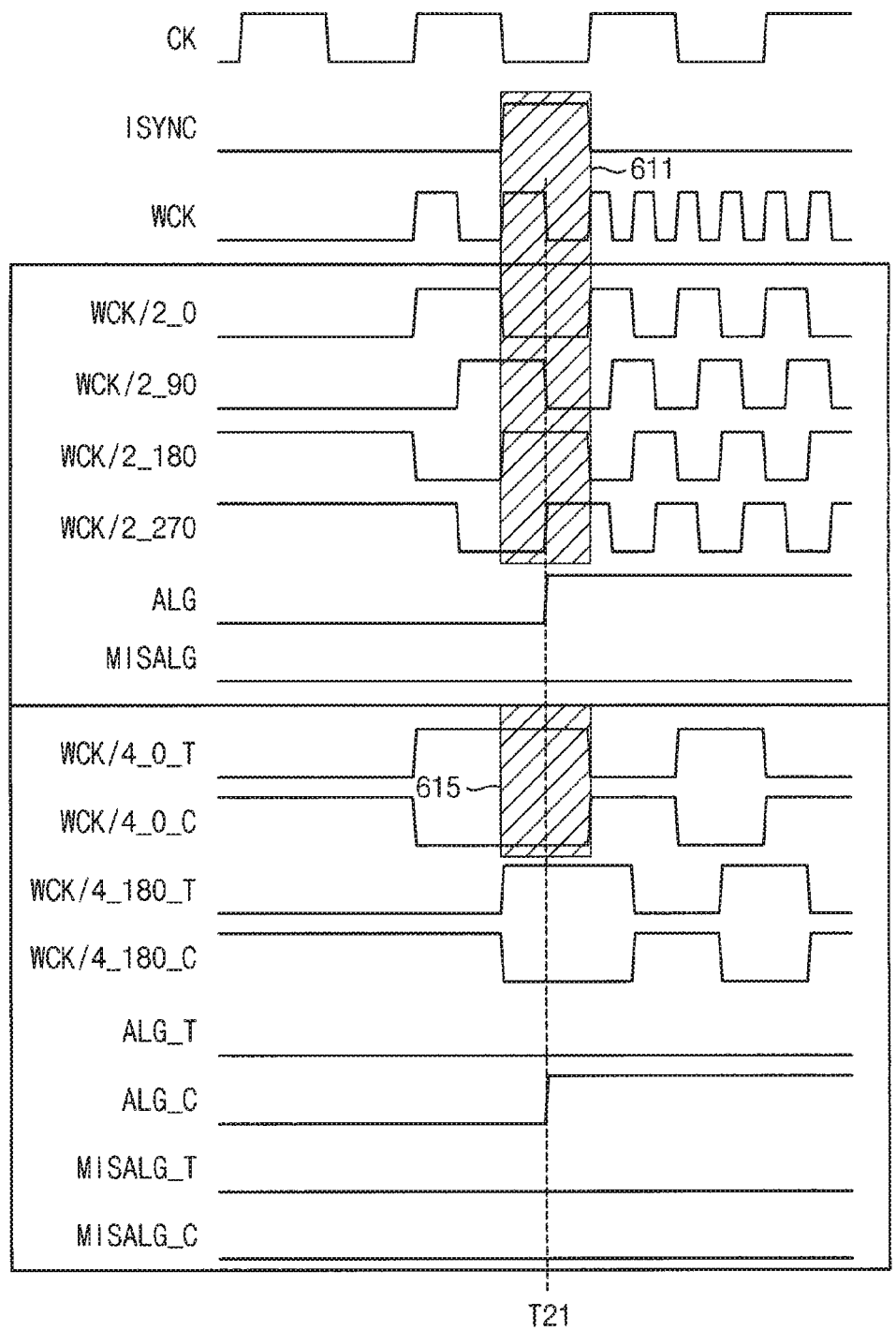

Referring to FIG. 17B, the second divided-by-two clock signal WCK/2_90 and the second divided-by-four clock signal WCK/4_0_C are synchronized with the data clock signal WCK as indicated by reference numerals 611 and 615 and the first divided-by-two alignment signal ALG and the second divided-by-four alignment signal ALG_C transit to a high level from a time point T21.

Figure 17C:
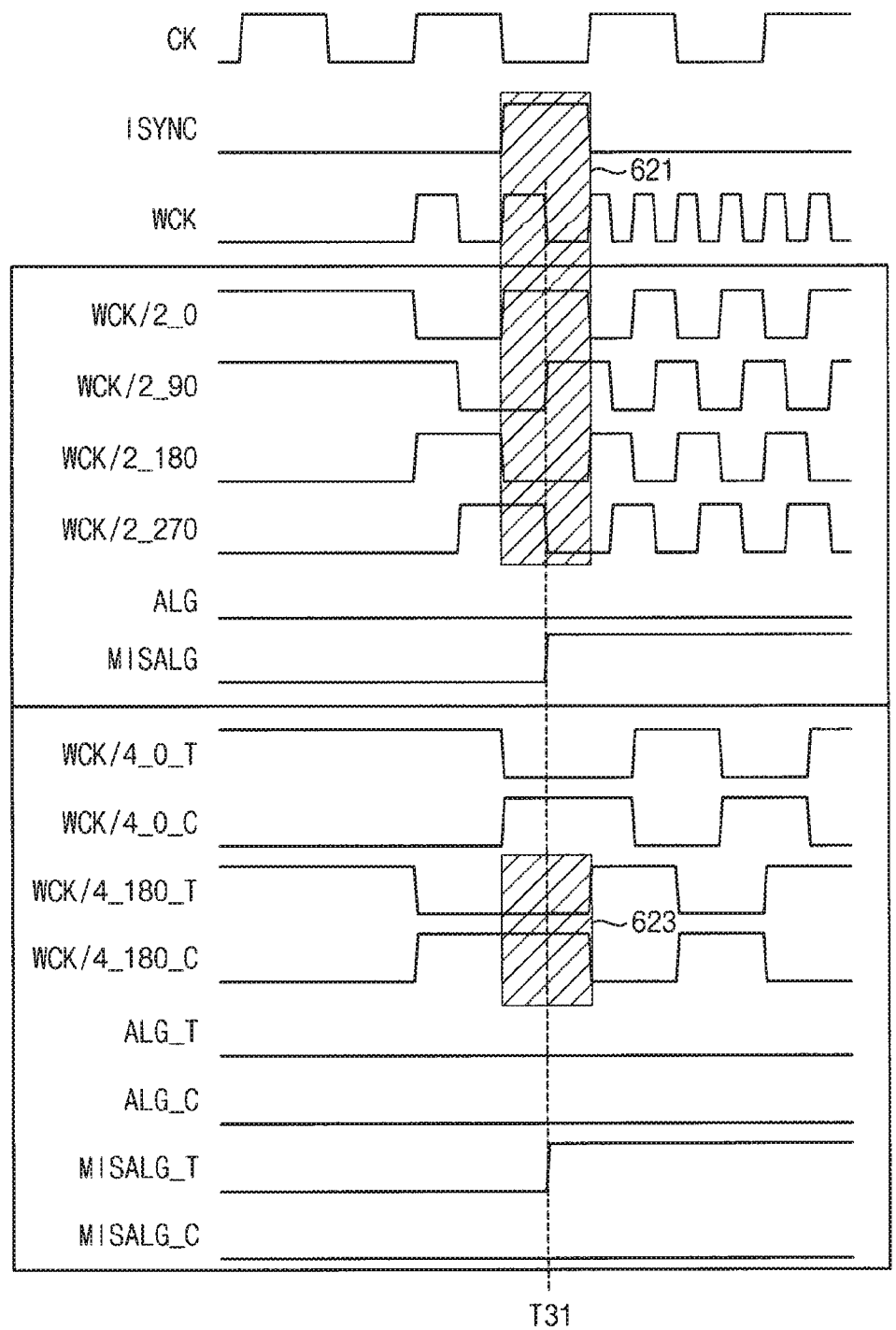

Referring to FIG. 17C, the fourth divided-by-two clock signal WCK/2_270 and the third divided-by-four clock signal WCK/4_180_T are synchronized with the data clock signal WCK as indicated by reference numerals 621 and 623, and the second divided-by-two alignment signal MIS-ALG and the third divided-by-four alignment signal MIS-ALG_T transit to a high level from a time point T31.

Figure 17D:
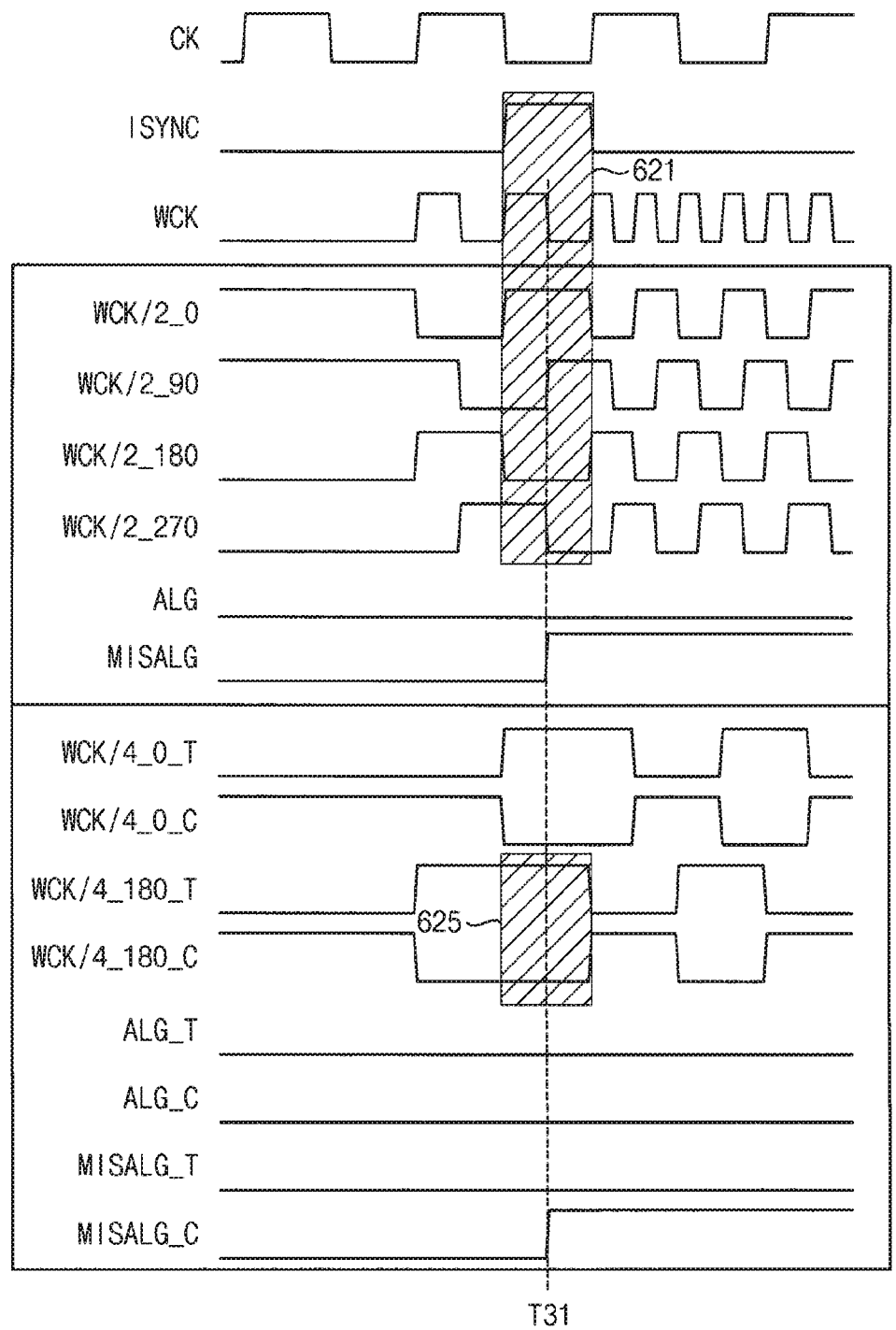

Referring to FIG. 17D, the fourth divided-by-two clock signal WCK/2_270 and the fourth divided-by-four clock signal WCK/4_180_C are synchronized with the data clock signal WCK as indicated by reference numerals 621 and 625, and the second divided-by-two alignment signal MIS-ALG and the fourth divided-by-four alignment signal MIS-ALG_C transit to a high level from a time point T31.

FIGS. 18A, 18B, 18C and 18D illustrate timing control diagrams of a latency control circuit according to one or more example embodiments. For example, the timing control diagrams may correspond to the latency control circuit of FIG. 10.

In FIGS. 18A, 18B, 18C and 18D, the data clock signal WCK is received abnormally as indicated by a reference numeral 630 before the clock synchronization signal ISYNC transits to a high level.

Figure 18A:
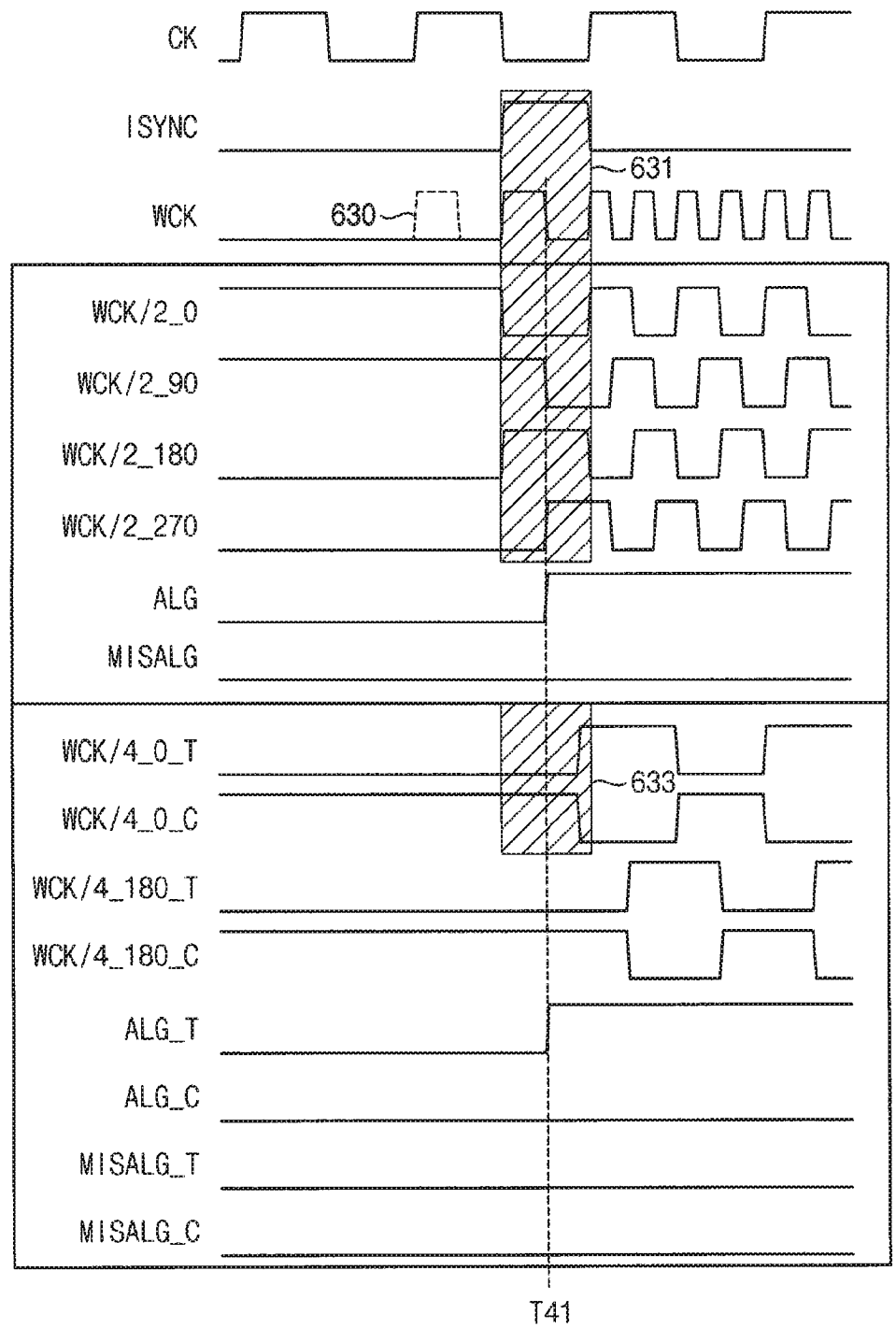
FIGS. 18A, 18B, 18C and 18D illustrate timing control diagrams of a latency control circuit according to one or more example embodiments.

Referring to FIG. 18A, the second divided-by-two clock signal WCK/2_90 and the first divided-by-four clock signal WCK/4_0_T are synchronized with the data clock signal WCK as indicated by reference numerals 631 and 633 and the first divided-by-two alignment signal ALG and the first divided-by-four alignment signal ALG_T transit to a high level from a time point T41.

Figure 18B:
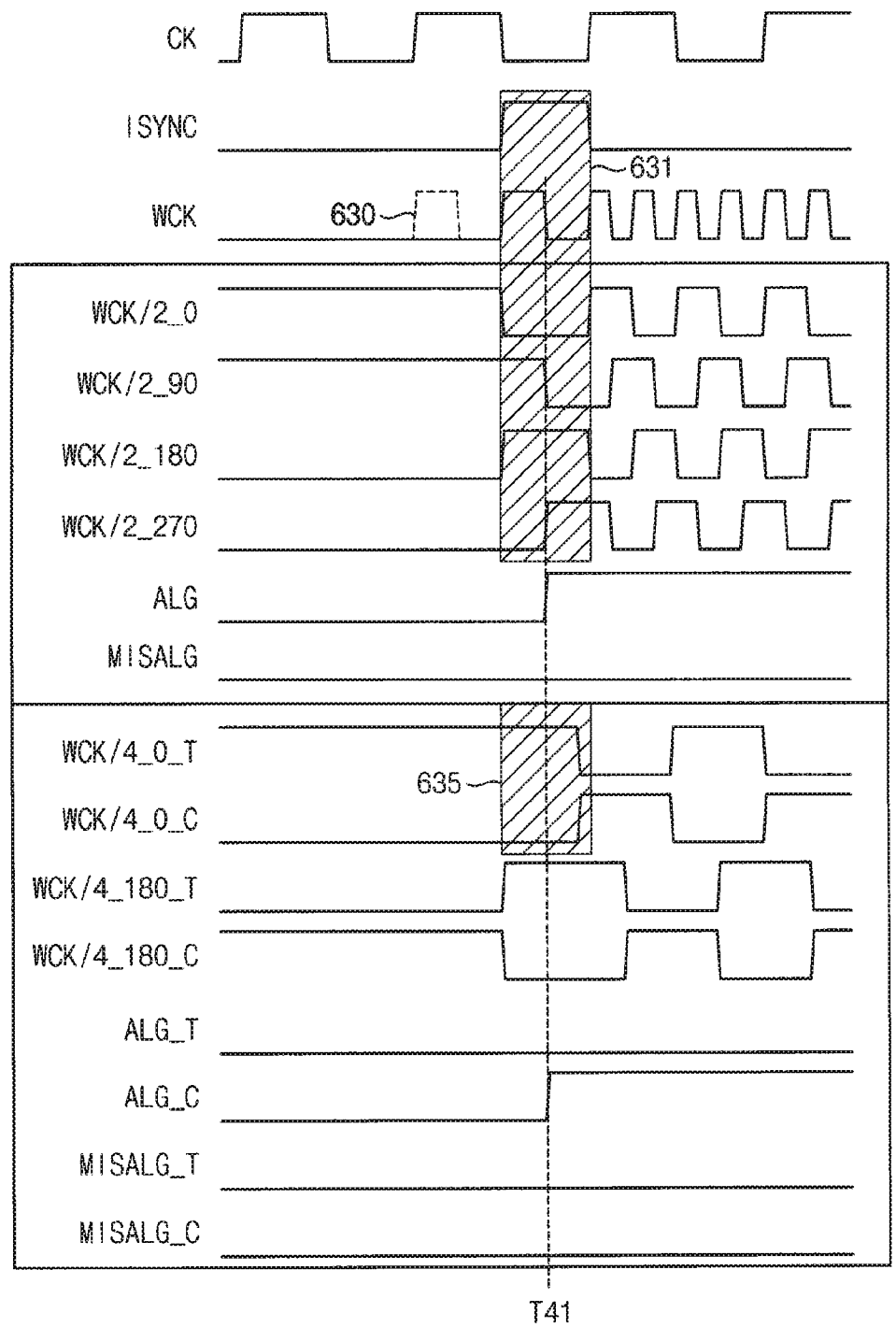

Referring to FIG. 18B, the second divided-by-two clock signal WCK/2_90 and the second divided-by-four clock signal WCK/4_0_C are synchronized with the data clock signal WCK as indicated by reference numerals 631 and 655 and the first divided-by-two alignment signal ALG and the second divided-by-four alignment signal ALG_C transit to a high level from a time point T41.

Figure 18C:
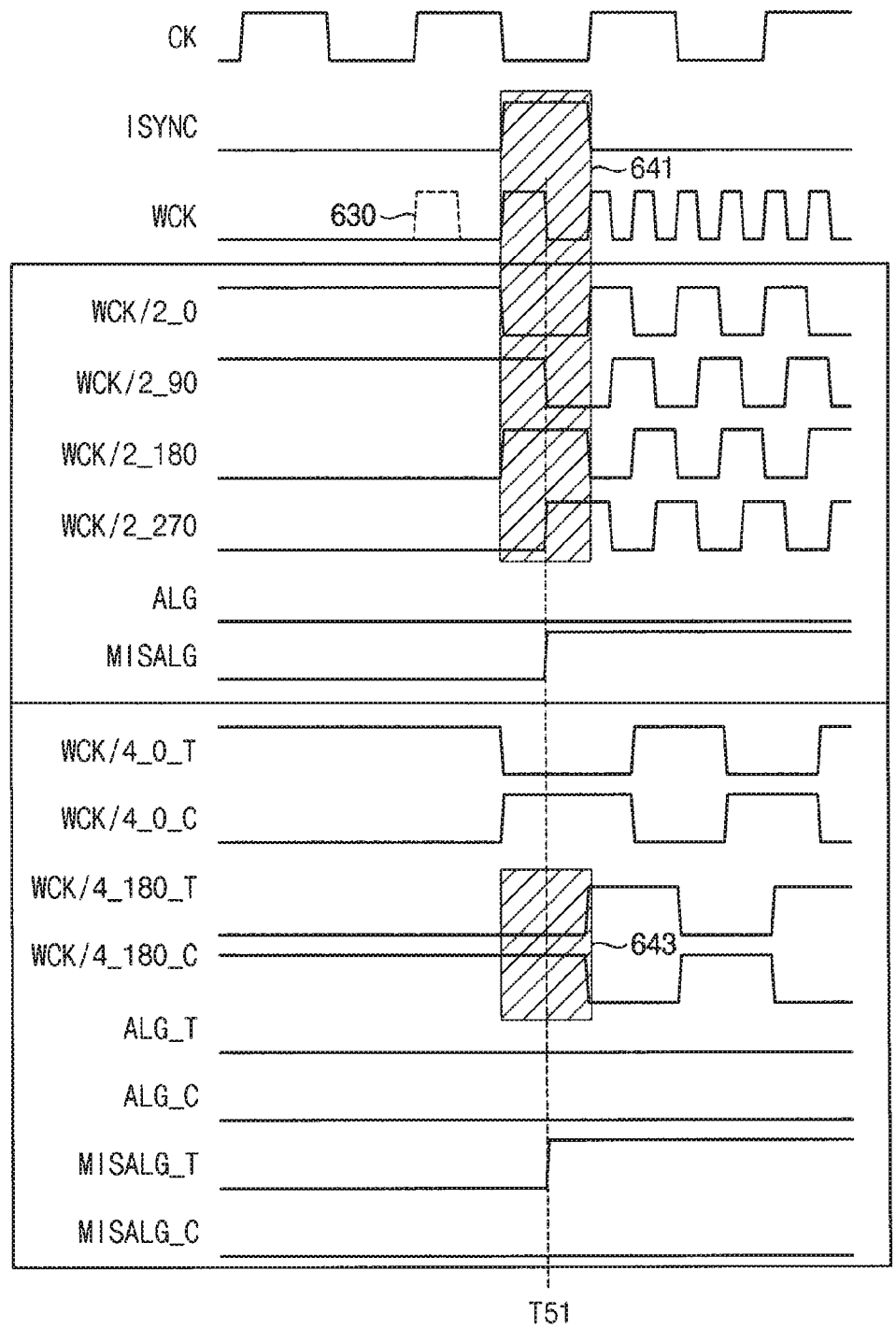

Referring to FIG. 18C, the fourth divided-by-two clock signal WCK/2_270 and the third divided-by-four clock signal WCK/4_180_T are synchronized with the data clock signal WCK as indicated by reference numerals 641 and 643, and the second divided-by-two alignment signal MIS-ALG and the third divided-by-four alignment signal MIS-ALG_T transit to a high level from a time point T51.

Figure 18D:
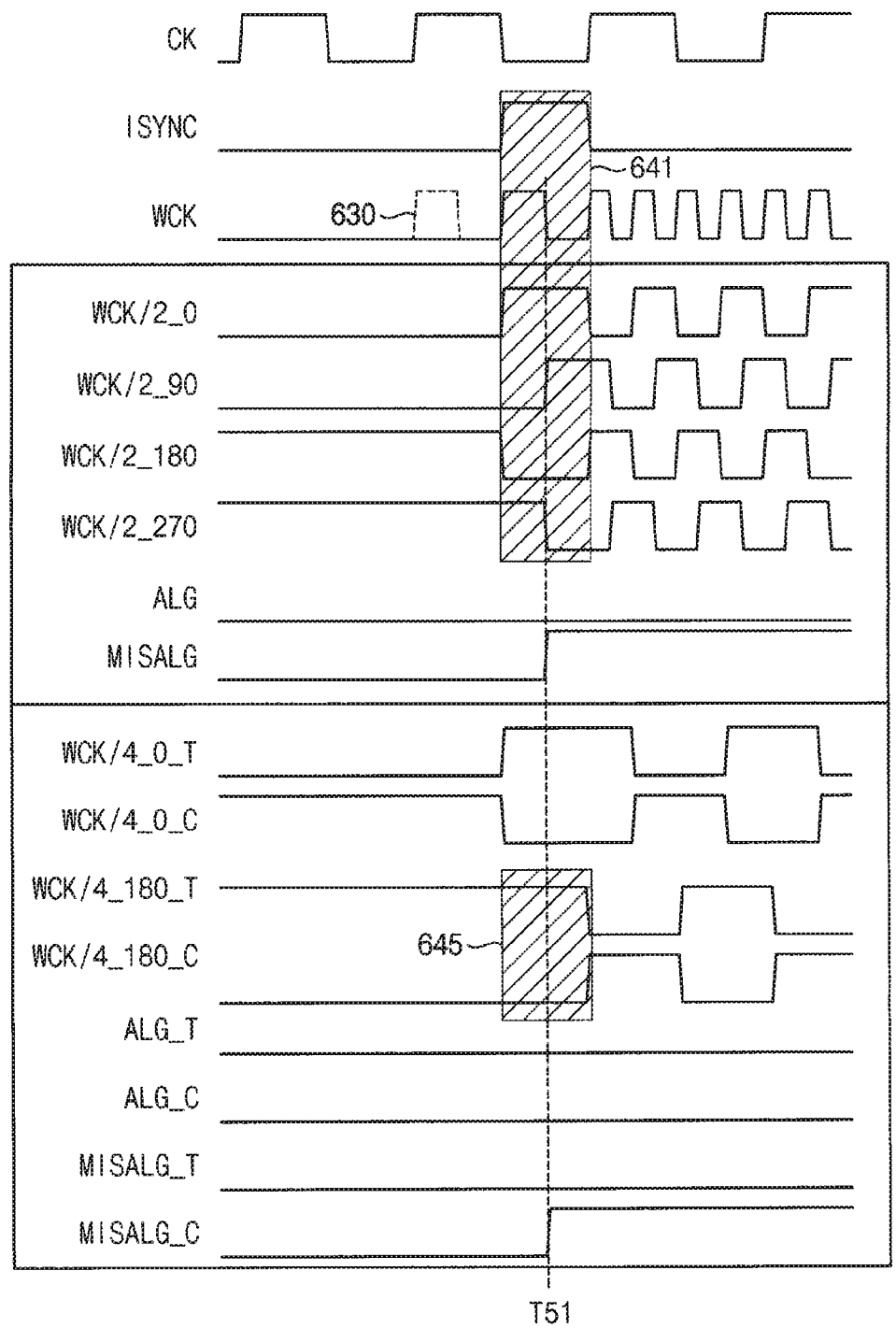

Referring to FIG. 18D, the fourth divided-by-two clock signal WCK/2_270 and the fourth divided-by-four clock signal WCK/4_180_C are synchronized with the data clock signal WCK as indicated by reference numerals 641 and 645, and the second divided-by-two alignment signal MIS-ALG and the fourth divided-by-four alignment signal MIS-ALG_C transit to a high level from a time point T51.

In FIGS. 10 through 16, 17A, 17B, 17C, 17D, 18A, 18B, 18C and 18D, the second divider 420 may use the divided-by-two clock signals WCK/2_90 and WCK/2_270 instead of the divided-by-two clock signals WCK/2_0 and WCK/2_180.

Figure 19:
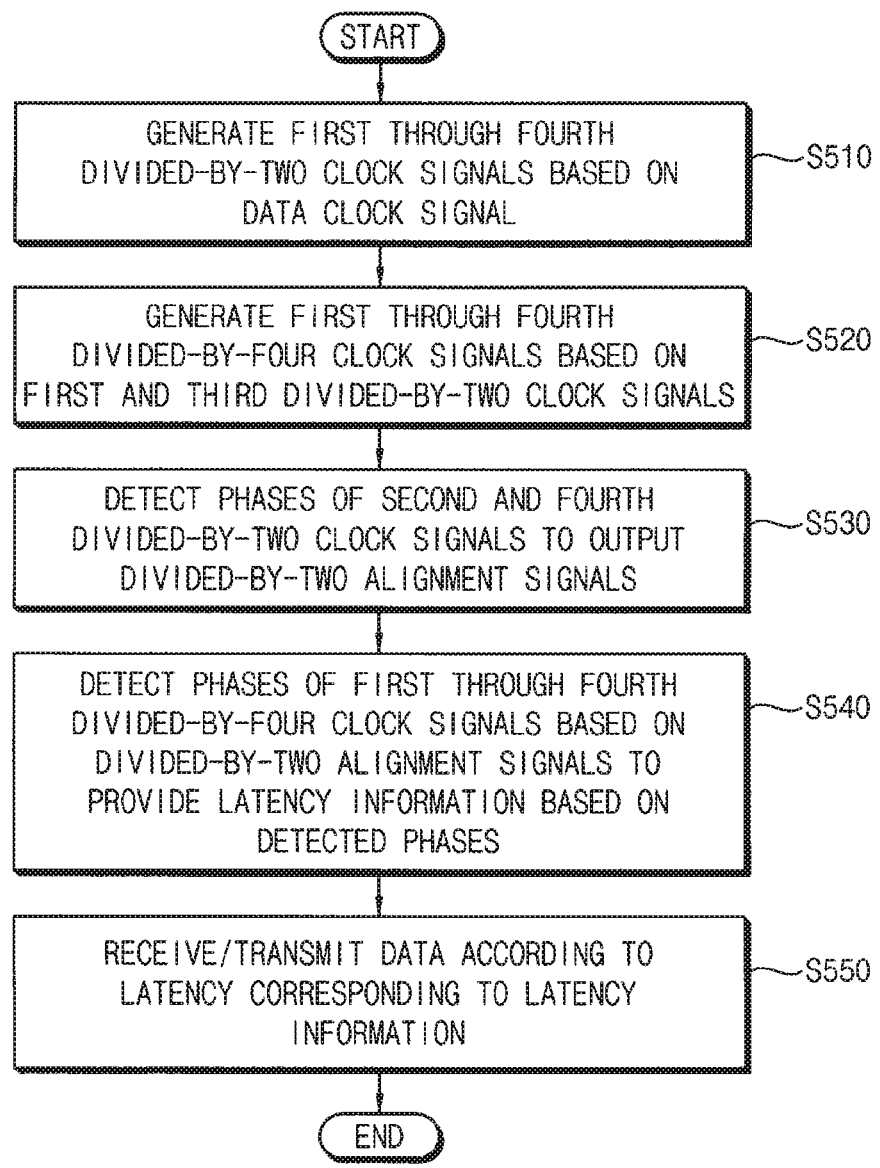
FIG. 19 is a flowchart illustrating a method of operating a memory device according to one or more example embodiments.

FIG. 19 is a flowchart illustrating a method of operating a memory device according to example embodiments.

Referring to 5 through 16, 17A, 17B, 17C, 17D, 18A, 18B, 18C, 18D and 19, in a method of operating the memory device 100, in operation S510, the latency control circuit 400 generates a plurality of divided-by-two clock signals WCK/2_0, WCK/2_90, WCK/2_180, and WCK/2_270 based on a data clock signal WCK. In operation S520, the latency control circuit 400 divides first two divided-by-two clock signals WCK/2_0 and WCK/2_180 to generate first through fourth divided-by-four clock signals WCK/4_0_T, WCK/4_0_C, WCK/4_180_T, and WCK/4_180_C. In operation S530, the latency control circuit 400 detects phases of second two divided-by-two clock signals WCK/2_90 and WCK/2_270 to generate divided-by-two alignment signals ALG and MISALG indicating whether the divided-by-two clock signals WCK/2_90 and WCK/2_270 are synchronized with the data clock signal WCK. In operation S540, the latency control circuit 400 detects phases of the divided-by-four clock signals WCK/4_0_T, WCK/4_0_C, WCK/4_180_T and WCK/4_180_C, and adjusts latency LTC associated with the main clock signal CK to output the adjusted latency as latency information LTI. In operation S550, the data I/O circuit 195 receives/transmits data according to a latency corresponding to the latency information LTI.

Figure 20:
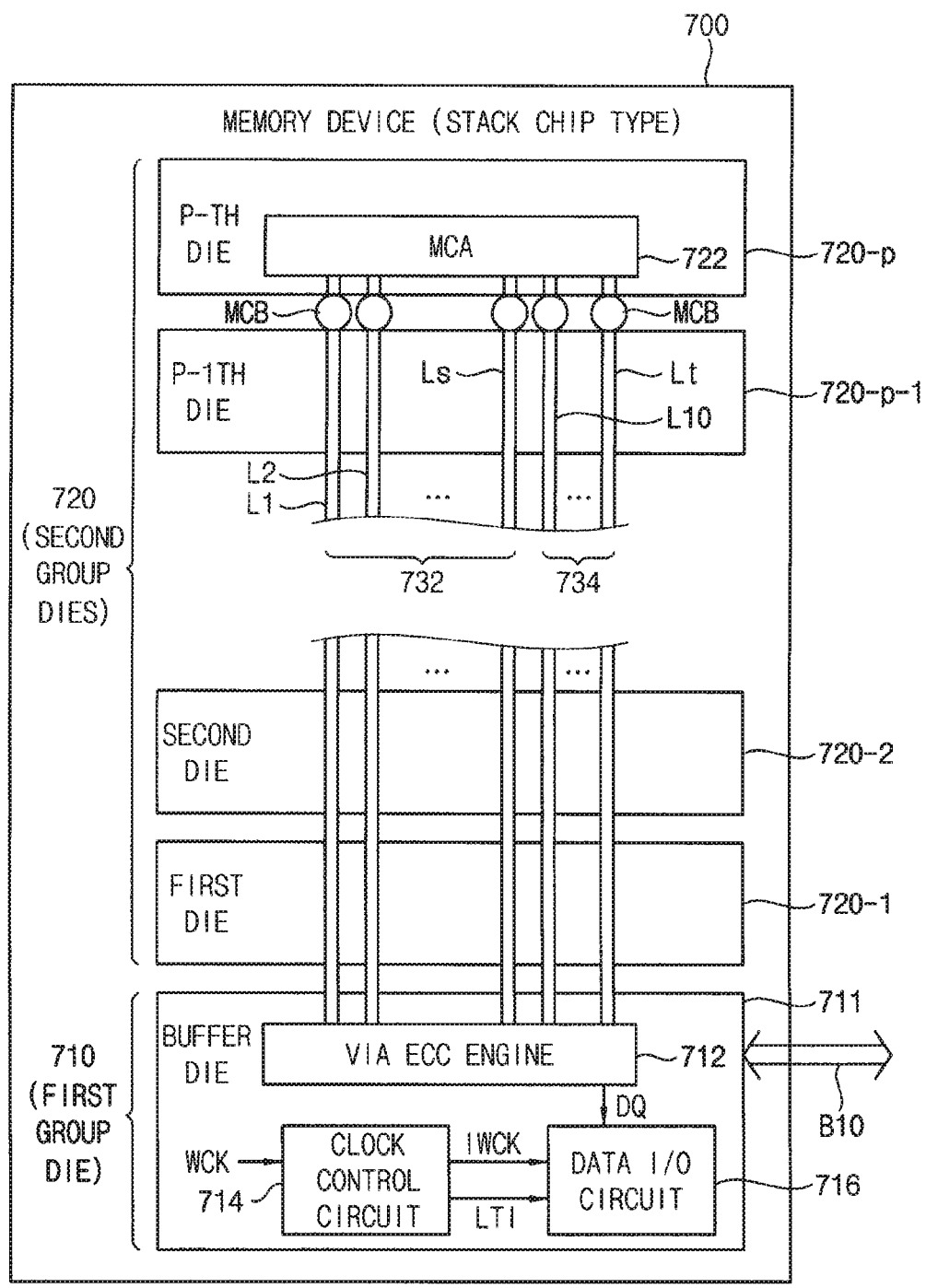
FIG. 20 is a block diagram illustrating a memory device according to one or more example embodiments.

FIG. 20 is a block diagram illustrating a memory device according to one or more example embodiments.

Referring to FIG. 20, a memory device 700, which is a stacked memory device, may include first group die 710 and second group dies 720.

The first group die 710 may include at least one buffer die 711. The second group dies 720 may include a plurality of memory dies 720-1 to 720-p which is stacked on the first group die 710 and conveys data through a plurality of through silicon via (TSV) lines.

At least one of the memory dies 720-1 to 720-p may include a memory cell array 722 to store data. The memory cell array 722 includes a plurality of dynamic memory cells.

The buffer die 711 may include an ECC engine 712 which corrects a transmission error using the transmission parity bits when a transmission error is detected from the transmission data received through the TSV lines and generates error-corrected data. The ECC engine 712 may be referred to as 'via ECC engine'. The buffer die 711 may further include a clock control circuit 714 and a data I/O circuit 716. The clock control circuit 714 may the clock synchronizing circuit and the latency control circuit which are mentioned above, and may receive a data clock signal WCK to provide an internal data clock signal IWCK and latency information LTI to the data I/O circuit 716. The data I/O circuit 716 may receive/transmit data DQ by using the internal data clock signal IWCK according to a latency corresponding to the latency information LTI in a write operation and a read operation.

The memory device 700 may be a stack chip type memory device or a stacked memory device which conveys data and control signals through the TSV lines. The TSV lines may be also called 'through electrodes'.

With the above description, a data TSV line group 732 which is formed at one memory die 720-p may include TSV lines L1 to Ls, and a parity TSV line group 734 may include TSV lines L10 to Lt. Here, s and t are integers greater than one.

The TSV lines L1 to Ls of the data TSV line group 732 and the parity TSV lines L10 to Lt of the parity TSV line group 734 may be connected to micro bumps MCB which are correspondingly formed among the memory dies 720-1 to 720-*p*.

The memory device 700 may have a three-dimensional (3D) chip structure or a two-and-a-half-dimensional (2.5D) chip structure to communicate with the host through a data bus B10. The buffer die 711 may be connected with the memory controller through the data bus B10.

The ECC engine 712, denoted as the via ECC engine, may determine whether a transmission error of the transmission data received through the data TSV line group 732 has occurred based on the transmission parity bits received through the parity TSV line group 734. When a transmission error is detected, the ECC engine 712 may correct the transmission data using the transmission parity bits. When the transmission error is uncorrectable, the ECC engine 712 may output information indicating occurrence of an uncorrectable data error.

Figure 21:
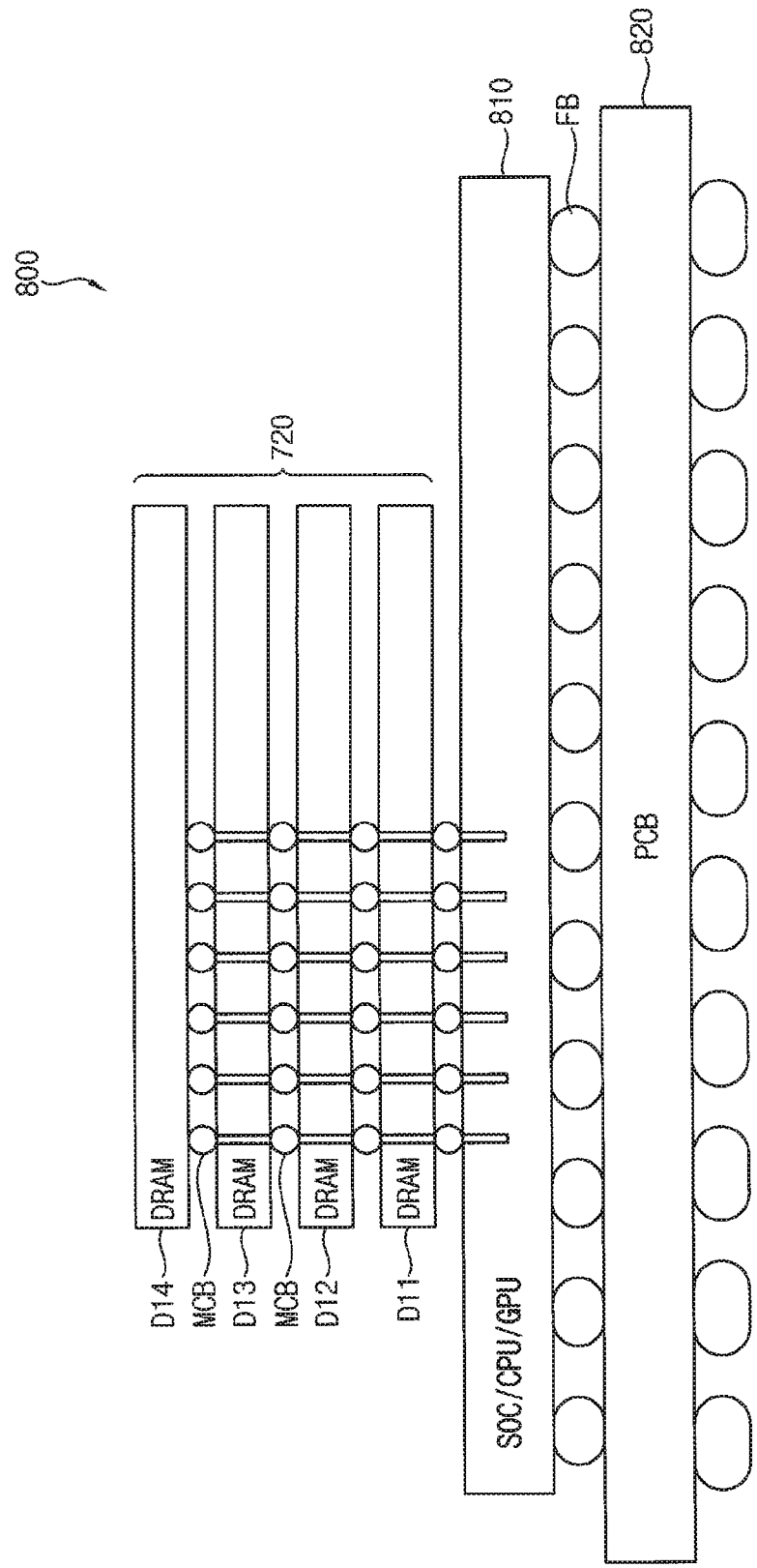
FIG. 21 is a cross-sectional view of a 3D chip structure employing a semiconductor memory device according to one or more example embodiments.

FIG. 21 is a cross-sectional view of a 3D chip structure according to one or more example embodiments. For example, the 3D chip structure illustrated in FIG. 21 may employ the semiconductor memory device of FIG. 20.

FIG. 21 shows a 3D chip structure 800 in which a host and a high bandwidth memory (HBM) are directly connected without an interposer layer.

Referring to FIG. 21, a host die 810, such as a system-on-chip (SoC), a central processing unit (CPU), or a graphic processing unit (GPU), may be disposed on a printed circuit board (PCB) 820 using flip chip bumps FB. Memory dies D11 to D14 may be stacked on the host die 810 to implement a HBM structure such as the memory dies 720 in FIG. 20. In FIG. 21, the buffer die 711 or a logic die of FIG. 20 is omitted. However, the buffer die 711 or the logic die may be disposed between the memory die D11 and the host die 810. To implement the HBM structure, such as the memory dies 720, TSV lines may be formed at the memory dies D11 and D14. The TSV lines may be electrically connected with micro bumps MCB placed between memory dies.

Figure 22:
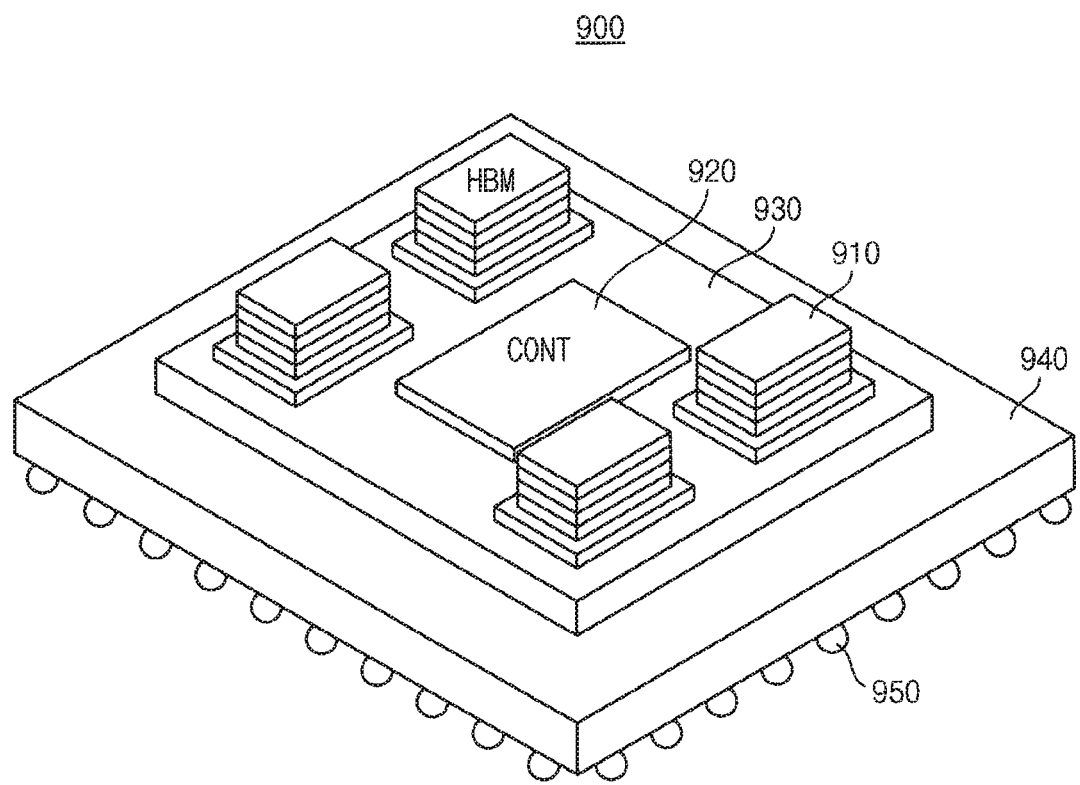
FIG. 22 is a configuration diagram illustrating a semiconductor package including a memory device according to one or more example embodiments.

FIG. 22 is a configuration diagram illustrating a semiconductor package including a memory device according to one or more example embodiments.

Referring to FIG. 22, a semiconductor package 900 may include one or more memory devices 910 and a memory controller 920. For example, the memory devices 910 may be stacked.

The stacked memory devices 910 and memory controller 920 may be mounted on an interposer 930, and the interposer on which the stacked memory device 910 and memory controller 920 are mounted may be mounted on a package substrate 940. The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a high bandwidth memory (HBM) in which a plurality of layers are stacked.

Accordingly, the stacked memory device 910 may include a buffer die and a plurality of memory dies, Additionally, the buffer die may include a clock control circuit.

The plurality of stacked memory devices 910 may be mounted on the interposer 930, and memory controller 920 may communicate with the plurality of stacked memory devices 910. Here, the interposer 930 may include a TSV form, an embedded multi-die interconnect bridge (EMIB) which is non-TSV manner or a printed circuit board (PCB) form.

Aspects of the present disclosure may be applied to various memory devices using a data clock signal and a main clock signal.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory device, comprising:
a clock buffer configured to receive a main clock signal and to provide an internal main clock signal to a core circuit;
a data clock buffer to receive a data clock signal; and
a latency control circuit configured to generate latency information based on the data clock signal and provide the latency information to a data input/output (I/O) circuit,
wherein the latency control circuit comprises:
a first divider configured to generate a plurality of divided-by-two clock signals based on the data clock signal, wherein the plurality of divided-by-two clock signals comprises a first group of divided-by-two clock signals and a second group of divided-by-two clock signals;
a second divider configured to generate a plurality of divided-by-four clock signals based on the first group of divided-by-two clock signals;
a first synchronization detector configured to output a plurality of divided-by-two alignment signals indicating whether the second group of divided-by-two clock signals is synchronized with the data clock signal, wherein the plurality of divided-by-two alignment signals is generated based on phases of the second group of divided-by-two clock signals based on a clock synchronization signal; and
a latency selector configured to detect automatically phases of the plurality of divided-by-four clock signals based on the plurality of divided-by-two alignment signals and adjust a latency of the main clock signal based on the phases of the plurality of divided-by-four clock signals.

2. The memory device of claim 1, wherein the latency selector is further configured to generate a plurality of divided-by-four alignment signals indicating whether the plurality of divided-by-four clock signals is synchronized with the data clock signal, and adjust the latency of the main clock signal based on at least one of the plurality of divided-by-four alignment signals and a corresponding one of the plurality of divided-by-four clock signals.

3. The memory device of claim 1, wherein:
the plurality of divided-by-two clock signals comprises a first divided-by-two clock signal, a second divided-by-two clock signal, a third divided-by-two clock signal and a fourth divided-by-two clock signal;
the first group of divided-by-two clock signals comprises the second divided-by-two clock signal and the fourth divided-by-two clock signal, the second divided-by-two clock signal and the fourth divided-by-two clock signal have a phase difference of 180 degrees with respect to each other;

the second group of divided-by-two clock signals comprises the first divided-by-two clock signal and the third divided-by-two clock signal, the first divided-by-two clock signal and the third divided-by-two clock signal have a phase difference of 180 degrees with respect to each other; and the first divided-by-two clock signal and the second divided-by-two clock signal have a phase difference of 90 degrees with respect to each other.

4. The memory device of claim 3, wherein the first synchronization detector is further configured to activate a first divided-by-two alignment signal of the plurality of divided-by-two alignment signals based on a falling edge of the second divided-by-two clock signal.

5. The memory device of claim 3, wherein the first synchronization detector is further configured to activate a second divided-by-two alignment signal of the plurality of divided-by-two alignment signals based on a falling edge of the fourth divided-by-two clock signal.

6. The memory device of claim 1, wherein the latency selector comprises:
a second synchronization detector configured to output a first divided-by-four alignment signal and a second divided-by-four alignment signal respectively indicating whether a first divided-by-four clock signal and a second divided-by-four clock signal of the plurality of divided-by-four clock signals are synchronized with the data clock signal based on a first divided-by-two alignment signal of the plurality of divided-by-two alignment signals;
a third synchronization detector configured to output a third divided-by-four alignment signal and a fourth divided-by-four alignment signal respectively indicating whether a third divided-by-four clock signal and a fourth divided-by-four clock signal of the plurality of divided-by-four clock signals are synchronized with the data clock signal based on a second divided-by-two alignment signal of the plurality of divided-by-two alignment signals; and
a selection circuit configured to receive the plurality of divided-by-four clock signals, adjust a plurality of adjusted latencies associated with the plurality of divided-by-four clock signals respectively, based on the first divided-by-four clock signal, the second divided-by-four clock signal, the third divided-by-four clock signal and the fourth divided-by-four alignment signal and select one of the plurality of adjusted latencies as the latency information.

7. The memory device of claim 6, wherein the selection circuit is configured to select an adjusted latency corresponding to an activated one of the first divided-by-four alignment signal, the second divided-by-four alignment signal, the third divided-by-four alignment signal and the fourth divided-by-four alignment signal as the latency information.

8. The memory device of claim 6, wherein the second synchronization detector is further configured to:
activate the first divided-by-four alignment signal based on the first divided-by-four clock signal having a low level at an edge of the first divided-by-two alignment signal; and activate the second divided-by-four alignment signal based on the second divided-by-four clock signal having a low level at the edge of the first divided-by-two alignment signal.

9. The memory device of claim 6, wherein the third synchronization detector is configured to:
activate the third divided-by-four alignment signal based on the third divided-by-four clock signal having a low level at an edge of the second divided-by-two alignment signal; and
activate the fourth divided-by-four alignment signal based on the fourth divided-by-four clock signal having a low level at the edge of the second divided-by-two alignment signal.

10. The memory device of claim 6, wherein the second synchronization detector comprises:
a first inverter configured to invert the first divided-by-four clock signal;
a first flip-flop configured to latch a first inverter output of the first inverter based on a first edge of the first divided-by-two alignment signal to generate the first divided-by-four alignment signal;
a second inverter configured to invert the second divided-by-four clock signal; and
a second flip-flop configured to latch a second inverter output of the second inverter based on the first edge of the first divided-by-two alignment signal to generate the first divided-by-four alignment signal.

11. The memory device of claim 10, wherein the second synchronization detector further comprises:
a third inverter configured to invert the third divided-by-four clock signal;
a third flip-flop configured to latch an output of the third inverter based on a second edge of the second divided-by-two alignment signal to generate the third divided-by-four alignment signal;
a fourth inverter configured to invert the fourth divided-by-four clock signal; and
a fourth flip-flop configured to latch an output of the fourth inverter based on the second edge of the second divided-by-two alignment signal to generate the fourth divided-by-four alignment signal.

12. The memory device of claim 6, wherein the selection circuit comprises:
a first latency adjusting circuit configured to receive the latency, adjust the latency based on the first divided-by-four clock signal and output a first adjusted latency as a first sub latency information based on the first divided-by-four alignment signal being activated;
a second latency adjusting circuit configured to receive the latency, adjust the latency based on the second divided-by-four clock signal and output a second adjusted latency as a second sub latency information based on the second divided-by-four alignment signal being activated;
a third latency adjusting circuit configured to receive the latency, adjust the latency based on the third divided-by-four clock signal and output a third adjusted latency as a third sub latency information based on the third divided-by-four alignment signal being activated;
a fourth latency adjusting circuit configured to receive the latency, adjust the latency based on the fourth divided-by-four clock signal and output a fourth adjusted latency as a fourth sub latency information based on the fourth divided-by-four alignment signal being activated; and an OR gate configured to generate the latency information by performing an OR operation on the first sub latency information, the second sub latency information, the third sub latency information and the fourth sub latency information.

13. The memory device of claim 12, wherein one from among the first latency adjusting circuit, the second latency adjusting circuit, the third latency adjusting circuit, and the fourth latency adjusting circuit is enabled based on the first divided-by-four alignment signal, the second divided-by-four alignment signal, the third divided-by-four alignment signal and the fourth divided-by-four alignment signal.

14. The memory device of claim 6, wherein the selection circuit comprises:
 a first latency adjusting circuit configured to receive the latency, adjust the latency based on the first divided-by-four clock signal and output a first sub latency information;
 a second latency adjusting circuit configured to receive the latency, adjust the latency based on the second divided-by-four clock signal and output a second sub latency information;
 a third latency adjusting circuit configured to receive the latency, adjust the latency based on the third divided-by-four clock signal and output a third sub latency information;
 a fourth latency adjusting circuit configured to receive the latency, adjust the latency based on the fourth divided-by-four clock signal and output a fourth sub latency information; and
 a multiplexer configured to select one from among the first sub latency information, the second sub latency information, the third sub latency information and the fourth sub latency information as the latency information to output based on the first divided-by-four alignment signal, the second divided-by-four alignment signal, the third divided-by-four alignment signal and the fourth divided-by-four alignment signal.

15. A memory device, comprising:
 a memory cell array comprising a plurality of bank arrays;
 a command decoder configured to output a clock synchronization signal based on a clock synchronization command synchronized with a main clock signal;
 a bank control logic configured to generate a plurality of bank control signals to control the plurality of bank arrays based on a bank address in an address signal;
 a clock synchronizing circuit configured to generate a plurality of divided-by-two clock signals based on a data clock signal and output one of the plurality of divided-by-two clock signals as an internal data clock signal;
 a latency control circuit configured to generate a plurality of divided-by-four clock signals based a first group of the plurality of divided-by-two clock signals, generate a plurality of divided-by-two alignment signals that indicate whether the plurality of divided-by-two clock signals is synchronized with the data clock signal based on the clock synchronization signal, identify phases of the plurality of divided-by-four clock signals based on the plurality of divided-by-two alignment signals, and adjust a latency associated with the main clock signal based on the phases of the plurality of divided-by-four clock signals to output latency information associated with the internal data clock signal; and
 a data input/output (I/O) circuit configured to transceive data based on the internal data clock signal and the latency information,
 wherein each of the plurality of bank arrays comprises a plurality of dynamic memory cells coupled to a plurality of word-lines and a plurality of bit-lines.

16. The memory device of claim 15, wherein the latency control circuit comprises:
 a divider configured to generate the plurality of divided-by-four clock signals based on a first group of divided-by-two clock signals of the plurality of divided-by-two clock signals;
 a first synchronization detector configured to output the plurality of divided-by-two alignment signals based on the clock synchronization signal, the plurality of divided-by-two alignment signals indicating whether a second group of divided-by-two clock signals of the plurality of divided-by-two clock signals is synchronized with the data clock signal; and
 a latency selector configured to identify phases of the plurality of divided-by-four clock signals based on the plurality of divided-by-two alignment signals, and adjust the latency of the main clock signal based on the phases of the plurality of divided-by-four clock signals.

17. The memory device of claim 16, wherein the latency selector is further configured to generate a plurality of divided-by-four alignment signals respectively indicating whether each of the plurality of divided-by-four clock signals is synchronized with the data clock signal and adjust the latency based on at least one of the plurality of divided-by-four alignment signals and a corresponding one of the plurality of divided-by-four clock signals.

18. The memory device of claim 15, further comprising an error correction code (ECC) engine configured to perform ECC encoding and decoding on the data.

19. The memory device of claim 15, further comprising a data clock buffer configured to receive the data clock signal and provide the data clock signal to the clock synchronizing circuit and the latency control circuit.

20. A memory device, comprising:
 at least one buffer die; and
 a plurality of memory dies stacked on the at least one buffer die and configured to transceive data through a plurality of through silicon via lines,
 wherein at least one of the plurality of memory dies comprises a memory cell array, and
 wherein the at least one buffer die comprises:
  a clock synchronizing circuit configured to generate a plurality of divided-by-two clock signals based on a data clock signal and output one of the plurality of divided-by-two clock signals as an internal data clock signal;
  a latency control circuit configured to generate a plurality of divided-by-four clock signals based on a first group of the plurality of divided-by-two clock signals, generate a plurality of divided-by-two alignment signals indicating whether the plurality of divided-by-two clock signals is synchronized with the data clock signal based on a clock synchronization signal, identify phases of the plurality of divided-by-four clock signals based on the plurality of divided-by-two alignment signals, and adjust latency of a main clock signal based on the phases of the plurality of divided-by-four clock signals, and output latency information associated with the internal data clock signal; and
  a data input/output circuit configured to transceive the data based on the internal data clock signal and the latency information.

* * * * *